United States Patent [19]
Komarek et al.

[11] Patent Number: 5,414,663
[45] Date of Patent: May 9, 1995

[54] VLSI MEMORY WITH AN IMPROVED SENSE AMPLIFIER WITH DUMMY BIT LINES FOR MODELING ADDRESSABLE BIT LINES

[75] Inventors: James A. Komarek, Balboa Beach; Scott B. Tanner, Irvine; Clarence W. Padgett, Westminster; Jack L. Minney, Irvine, all of Calif.

[73] Assignee: Creative Integrated Systems, Inc., Santa Ana, Calif.

[21] Appl. No.: 71,892

[22] Filed: Jun. 3, 1993

Related U.S. Application Data

[62] Division of Ser. No. 912,112, Jul. 9, 1992, Pat. No. 5,241,497.

[51] Int. Cl.[6] .................................. G11C 7/00
[52] U.S. Cl. .......................... 365/210; 365/233.5; 365/189.01
[58] Field of Search ............... 365/210, 233.5, 189.01, 365/205, 23.1

[56] References Cited

U.S. PATENT DOCUMENTS 4,989,182 1/1991 Mochizuki et al. ................. 365/210

*Primary Examiner*—Viet Q. Nguyen
*Assistant Examiner*—F. Niranjan
*Attorney, Agent, or Firm*—Daniel L. Dawes

[57] ABSTRACT

The operation of the sense amplifier in a VLSI memory is improved by providing dummy bit lines corresponding to the ON state and OFF state of the memory cells, averaging the voltage on the dummy bit lines, and comparing that average to the bit line voltage to generate a differential sense output. Leakage currents and voltages common to both the dummy bit lines and selected bit line are thus cancelled out.

Sense amplifiers incorporating this advantage may also be used in combination with a dynamic latch which is selectively disconnected from the memory array at all times other than during a memory cycle to avoid noise interference.

Dummy word lines used in combination with dummy predecoder and decoder are used to make on-chip determinations of the transition points when an address signal is valid and complete. The actual initiation of the addressing of the memory may then be triggered according to a modeled transition point within each memory circuit.

The worst ON state and OFF state voltages on dummy bit lines are used in a trigger circuit to generate a trigger signal for use in sense amplifiers which will reliably indicate when a valid sense decision can be made taking into consideration the individual process parameters and operating conditions of the actual memory circuit.

23 Claims, 21 Drawing Sheets

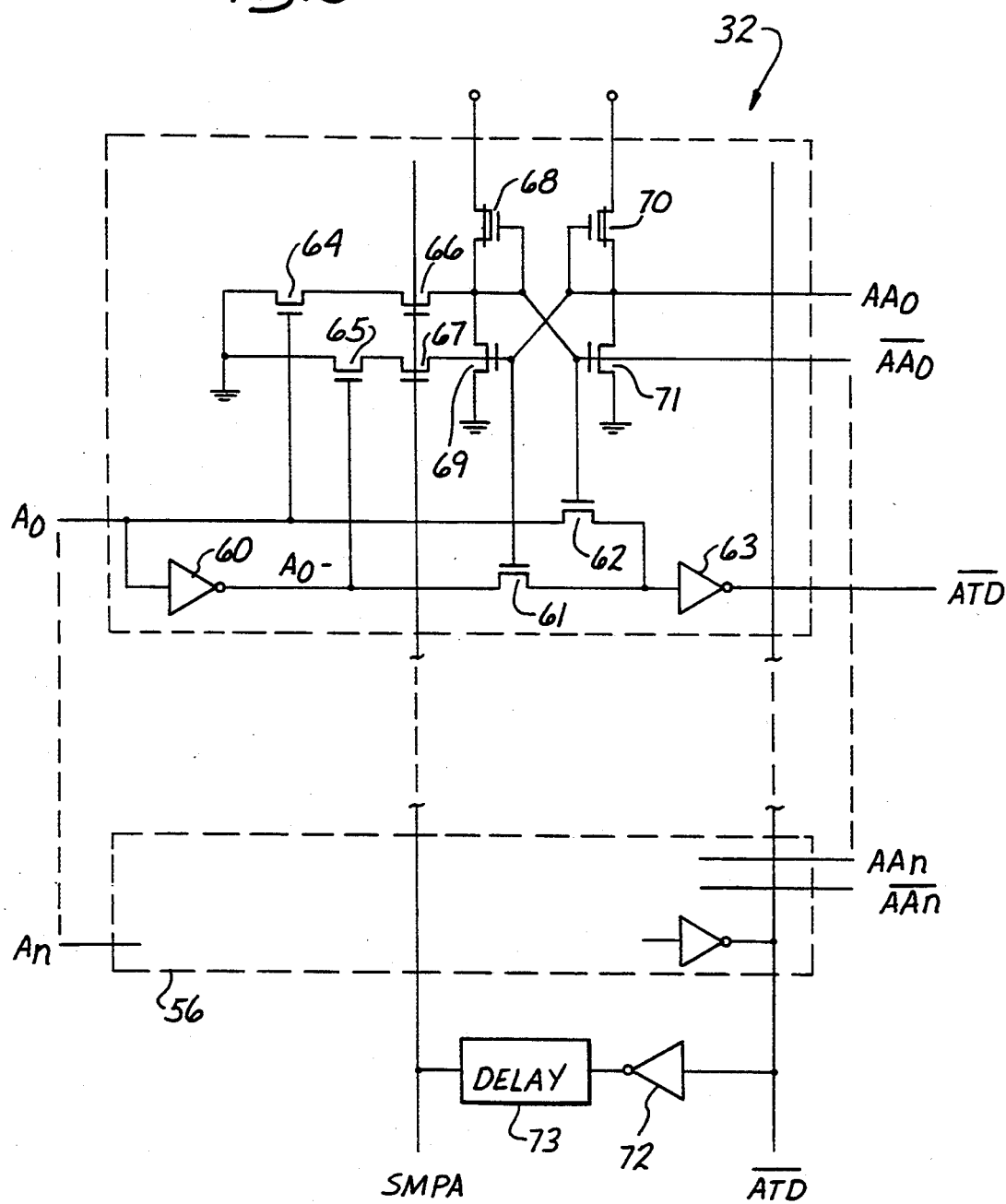

P = PRECHARGE LEVEL
P/H = PRECHAGE HOLD PERIOD
D/O = DATA OUTPUT PERIOD
D/L = DRIVEN LOW PERIOD
H/E = HOT ELECTRON PERIOD

VLSI MEMORY WITH AN IMPROVED SENSE AMPLIFIER WITH DUMMY BIT LINES FOR MODELING ADDRESSABLE BIT LINES

This is a division of application Ser. No. 07/912,112 filed on Jul. 9, 1992 now U.S. Pat. No. 5,241,497.

BACKGROUND OF THE INVENTION

1. Field of the Invention

The present invention relates to a read only memory (ROM), and in particular to improvements in the circuitry and methodology of the subcircuits included within a very large scale integrated (VLSI) ROM.

2. Description of the Prior Art

As shown in FIG. 1, the overall structure of a prior art ROM is typically comprised of an input buffer circuit, an address transition detector circuit (ATD), an X and Y decoder circuit, a sense amplifier for reading the memory cells. A plurality of memory cells are coupled to the input buffer and accessed through the X and Y decoder with their output coupled to the sense amplifier, and to an output buffer circuit having its input coupled to the output of the sense amplifier. The function of the input buffer is to convert a TTL level signal into a voltage level compatible with the ROM when an address signal is received at the ATD circuit. The function of the address transition detector circuit is to detect address transitions from the output of the input buffer in order to generate appropriate timing signals within the ROM. The X and Y decoders decode an address to select a predetermined memory cell within the array. The sense amplifier reads the data stored in the memory cell. The output from the seine amplifier is then buffered to the output circuit for a TTL level output. Such prior an architectures are prone to several limitations as discussed below.

Prior art input buffer circuits typically have an input inverter stage with a threshold of 1.4 volts and operate within a 0.8 low logic level and 2.0 volt high logic level from a 5-volt supply voltage. The output voltage levels of the typical input buffer has a high logic level of 2.4 volts and a low logic level of 0.4 volts. Noise in the power supply line or signal line into the input buffer can often cause a malfunction, particularly at high data rates in an LSI chip. The voltage margins between ground level and the level of the low logic output or between the low level output voltage in the low logic level input voltage is only 0.4 volts.

Therefore, the prior art has attempted to devise a solution wherein the initial input stage inverter of the input buffer is provided with a hysteresis property to prevent an instability which arises from ringing. The ringing can be caused when the input signal is convened from a high to low level or there is a drift or variation in the ground level. FIG. 16 shows a typical prior art circuit having just such a hysteresis property as described in IEEE International Solid State Circuits Conference Digest of Technical Papers (1988), at pages 182–183. The prior art circuit is comprised of two CMOS inverter stages 10 and 12. The output of the first inverter stage 10 is connected to the input of the second inverter stage 12. The output of the second inverter stage 12 is fedback to the gate of a PMOS transistor 14 coupled to the voltage supply VCC. PMOS transistor 14 is turned on when the input is at a low level, thereby maintaining the output of the inverter combination 10 and 12 at a low logic level. The buffer circuit of FIG. 16 can thus not again go high until a voltage of sufficient level and stability is provided to switch both inverter circuits 10 and 12 to turn off load transistor 14 allowing a high logic output.

However, the prior art circuit of FIG. 16 is subject to noise-induced malfunction. The LSI chip itself may create noise when the output buffer circuit is switched, in addition to being subject to externally created noise. The output buffer creates noise when the charge on a load capacitance flows into the ground line of the LSI chip from a driving transistor in the output buffer. A large tramconductance, $g_m$, of the driving transistor in the output buffer circuit causes the threshold value of an input inverter in the output buffer circuit to be substantially reduced and therefore easily influenced by a noise. For example, in the circuit of FIG. 16, the threshold value of the initial input inverter 10 is inevitably shifted by the high tramconductance of the driving transistor to cancel out the hysteresis property normally provided by load transistor 14 as described above. Hence, the input buffer of FIG. 16 becomes susceptible to noise based malfunctions, either from spikes on the LSI ground line or from externally created noise sources. Furthermore, the input buffer of FIG. 16 has the disadvantage that it cannot be implemented using only an NMOS methodology since PMOS load transistors are required.

Another limitation in the prior art pertains to address transition detection circuits. Conventional address transition detection circuits generate internal timing signals on the occurrence of an address transition. Typically in such an event all internal decode signals are set at a low level for a predetermined period after the address transition. This method is used in order to prevent power consumption caused by invalid addresses which occur during the transient state. However, this methodology results in a change in status of the internal decoding lines twice every time an address transition takes place. For example, after an address becomes valid the internal decoding is changed a first time to reflect the valid address and then goes to an all-logic low state and then transitions a second time to the next valid address. Power consumption is therefore increased at high data rates.

The prior an memories have also experienced shortcomings with respect to the memory array itself. A typical prior an planar memory cell array uses bit lines formed by diffusion layers and word lines of polycide which intersect the bit lines. The source and drain regions of the MOS transistors are defined in the intersections between the word and bit lines. Channels are formed between the source and drain regions. The prior art has employed the concept of utilizing a bank selection methodology to preselect a prescribed memory cell in such a planar memory array. As previously stated, the bit lines are fabricated as diffusion lines and are characterized by approximate 30 ohms per square sheet resistance. Since the pitch of the diffusion lines in the array is about equal to the pitch of the gate wiring, about two diffusion wire sheets are provided for every memory cell providing the source and drain connection for that cell. In the embodiment shown in FIG. 17 there is a resistance of about 2 kilo-ohms for 32 cells in terms of parasitic wiring resistance. This resistance varies from 0 to 2K ohms depending upon the cell's position.

When a memory cell is on, it has an internal resistance of about 19 kilo-ohms assuming that the on-state current is approximately 150 microamps and the bit line voltage is 1.5 volts. As a result, the number of memory cells provided between each group of bank select transistors 20 and 26, for example, is necessarily restricted in order to avoid unacceptable low relative voltage drops across the memory cells. This restriction in the number of cells between the bank select transistors not only decreases the degree of integration which can be achieved on the chip, but also limits the operational speed of the memory array.

As discussed above, the bit lines of such arrays are conventionally made of N+doped diffusion layers while the word lines are constructed of polycide. The selection transistor placed on the even bit lines is, as described, positioned at the upper end of each bit line. The gates of the selection transistors are driven by a common gate selection signal, SE. Similarly, transistors are placed in the lower end of the array for selecting the odd lines and are driven through their gates through a common select signal, SO. The main bit line, typically composed of aluminum, is connected to a contact opposite the nth and nth+1 bit lines. The same main bit line is connected to a contact opposite the nth+1 and nth+2 selection transistor bit lines. Analogously a virtual ground line is connected to the nth+2 and nth+3 odd selection bit transistors as well as the nth+3 and nth+4 even selection transistors. Main bit line 16 is connected directly to bit lines 22a and 22b respectively in the lower portion of the memory array in the proximity of column select transistors 26 and is connected to bit lines 22b and 22c respectively in the upper portion of the array in the vicinity of column select transistors 20. Similarly, the virtual ground line 18 is connected to bit lines 22c and 22d respectively in the lower portion of the array and is directly connected to bit lines (not shown) in the upper portion of the array.

When the even columns of the array are selected, the signal transmission path in the prior art circuit of FIG. 17 includes a path through the corresponding bit line selection transistor 20a, a first bit line, 22c, for example, then back up the target memory transistor 21, through a second bit line, 22d, for example, and then through a corresponding selection transistor 26b to the virtual ground 18. The capacity and resistance of the transmission path of the signal is thus twice that of the length of the bit line within the block. The same is true if the lowest row within an odd column is selected. As a result, such prior memories are subject to speed limitations and a restriction on the number of transistors which can be placed in a row within a single block. The degree of LSI integration is therefore limited.

It can also be readily appreciated by viewing FIG. 17 that the bank select transistors 20 and 26 which are associated with main bit line 16 and virtual ground line 18 are both disposed in the same proximity within the chip. Therefore, any memory cell in the array has a symmetrical wiring resistance in its source and drain wiring relative to main bit line 16 and virtual ground line 18, however, it varies from zero to a large value.

Prior art ROM circuitry also suffered from a limitation in the dynamic timing and control of the output signal. Information is stored in the ROM, depending on whether or not a preset electrical charge is discharged in response to an address signal. This charge is read by a sense circuit. The read decision of a memory cell is made depending on whether a precharge level in the memory cell is changed to a circuit threshold value by a transistor in the memory array. In such a read methodology the difference between the memory cell current and leakage current sometimes cannot be distinguished by the sense amplifier. This causes a malfunction upon generation of unacceptably high leakage currents.

In conventional read-only memories, especially NOR-type memories, fast response times and low power consumption has been difficult to achieve due to poor manipulation of the bit lines. More recently larger and faster memory devices are being developed for NOR-type read-only memories. Thus far, none has utilized any technology which has improved the management of the bit lines within the memory.

A large capacity ROM necessarily contemplates LSI architecture for the memory cells, whether NOR or NAND type. In order to make a conventional large scale and a greater memory cell respond faster, dynamic manipulation of the bit lines has been attempted. However, this approach has resulted in unacceptable power consumption and therefore has not been utilized.

What is needed then is a way to manipulate bit lines in an LSI memory cell dynamically without consuming a large amount of power.

To solve this, one prior art system as described in the 1988 IEEE International Solid State Circuits Conference Digest of Technical Papers, pages 124–125 is provided with reference cells and array cells to detect the difference in current between the array cell and reference cell between the on and off states by adding an offset current only on the on-state reading cycle of the array. While this approach solved the problem of leakage currents, an access delay is caused if the offset current is not equal to the average current flowing through the array cell during both the on and off states. Moreover, it is difficult to generate such an offset current independently of the voltage supply level.

Prior art output buffer circuits have experienced slow switching speeds in the NMOS output transistors. For example, as described in the IEEE Journal of Solid State Circuits, Vol. 23, No. 5, 1988 at pages 1054 1058, an output buffer circuit suppresses the peak of current flowing from an output pin by temporarily setting its output at an intermediate potential between the high and low logic levels. However, since the output is temporarily set at an intermediate potential, current flows through the output circuitry if a CMOS device is provided as the input of the next stage. In the circuit described in the 1988 IEEE Solid State Circuits Conference Digest of Technical Papers, pages 120–121, a bias signal is applied to an NMOS transistor in the final inverter stage of the output buffer circuit through a coupling transistor. The bias voltage is applied to a coupling transistor. Since the bias voltage is fixed between zero volts and the supply voltage, the switching speed of the final stage, NMOS transistor is increased. The increase in switching speed is utilized to suppress the peak current which flows from the output pin to ground when the output level switches from a high to a low logic level. However, since the switching rate of the NMOS transistor is increased, excessive time is required to convert the output to a high output level.

Among the efforts currently being made in the art to produce larger and denser semiconductor devices, is the use of dynamic circuits for constructing larger scale and faster memories. However, a conventional dynamic circuit has a data hold period in the buffer, that is, the period during which data must be held regardless of the circuit's gated diffusion capacity. Therefore, due to pattern layout architecture, performance during hold periods may be erratic. If the signal is affected by coupling noise input through a gate, the transistor may enter a half-on state, if not malfunctioning altogether, because the gate voltage is floating and not driven. This in turn leads to the emission of hot electrons. Hot electrons can affect the reliability of the array and can be substantial where the circuit is highly miniaturized. Therefore, what is needed is a dynamic circuit which is not affected by these coupling noises.

Refer briefly to FIG. 25 which shows a prior art circuit used to deal with noise in an output buffer. Noise is reduced by applying an intermediate voltage or bias to the gate of a transistor 350 when the input signal, IN, changes from the logic low to the logic high to cause transistor 352 to enter a half-on state which would gradually drain the current from the output port to ground. This increases the buffer's time delay when the process variations, device temperatures and/or voltage levels are in their slowest state.

The usual methods to generate a bias level is to generate an analog voltage that varies with temperature and process conditions and that allows some compensation in response to those conditions. In using these prior methods it is difficult to adjust the voltage level. The solution suffers from the limitation and the compensation tends to slow down to the slowest circuit part, thereby causing a substantial degradation in the worse case speed specification in the circuit. It is also important to note that when the circuit is in its slowest condition, compensation may not be necessary and may in effect be detrimental.

In this case, ff the bias voltage is fixed at an intermediate level, delay of the output buffer becomes excessively large even though the noise in the output buffer is reduced. What is needed then is a means and method of solving the problem with a bias voltage supply circuit which can adjust the bias voltage, taking process variations into consideration as well as circuit speed reaction to voltage level.

Therefore, it is an object of this invention to provide a ROM circuit which overcomes each of the above-discussed shortcomings of the prior art. For example, one object of the invention is to avoid noise induced malfunctions caused by the driving transistor in the input buffer circuit.

Another object is to provide an input buffer circuit which is usable in LSI chips based both on NMOS and CMOS technologies.

It is another object of the invention to provide a memory array which can be laid out in a smaller area as well as providing an increase in memory speed or decrease in access time.

It is further an object of the invention to provide a sense circuit in the ROM which can compensate for off-state current of the memory cells and leakage current in the memory cells to avoid malfunction.

It is still further an object of the invention to provide a sense circuit which can adjust loads in response to the driving signal from the memory cells in order to prevent loss of circuit speed and to reduce noise even if the on-state current in the memory cell is varied.

It is still further an object of the invention to provide an output buffer circuit which is not characterized by a high switching current and still has a fast switching speed.

BRIEF SUMMARY OF THE INVENTION

The performance of a very large scale integrated READ ONLY MEMORY circuit is improved by improvements in various circuits and methodologies utilized in the memory. The performance of a hysteresis address input buffer is improved by providing additional driving power to establish the high and low voltage transition points of the input buffer. The address transition detection circuit is improved by holding the previously latched address signal until a predetermined delay after receipt of the new address signal. The operation of signal buffers can be stabilized and the emission of hot electrons avoided by selectively coupling the input to the last stage of the buffer to a predetermined voltage during any precharge hold time interval. The memory array is improved by providing an architecture for the columns of memory cells so that the signal from the address memory cell need propagate only on the diffusion bit lines by a distance no greater and no less than the length of the diffusion bit line within a single block of the memory cells. The architecture of the memory layout is improved by providing bit line and virtual ground line contacts at opposing ends of the memory block and by replicating the memory block through mirror symmetry on the semiconductor substrate. The memory array is further improved by providing bank selection transistors for each bank at each opposing end of a memory block so that propagation of the contents of an address memory cell need only travel the length of a single bit diffusion line. The operation of the memory array is improved by a precharge methodology wherein virtual ground lines, main bit lines and bit diffusion lines are precharged on each memory cycle even though not selected and wherein said bit line to the sense amplifier is precharged though not selected. The operation of the sense amplifier is improved by providing dummy bit lines corresponding to the ON state and OFF state of the memory cells, averaging the voltage on the dummy bit lines, and comparing that average to the bit line voltage to generate a differential sense output. Leakage currents and voltages common to both the dummy bit lines and selected bit line are thus cancelled out. Sense amplifiers incorporating this advantage may also be used in combination with a dynamic latch which is selectively disconnected from the memory array at all times other than during a memory cycle to avoid noise interference. The bias of such sense amplifiers can be compensated to reflect individual process and operating variations in each memory circuit. Noise inserted on the ground line from an output buffer is avoided by providing a two-staged transition of the output buffer when selected to generate a low active output. Dummy word lines used in combination with dummy predecoder and decoder are used to make on-chip determinations of the transition points when an address signal is valid and complete. The actual initiation of the addressing of the memory may then be triggered according to a modeled transition point within each memory circuit. The ON state and OFF state voltages on dummy bit lines are used in a trigger circuit to generate a trigger signal for use in sense amplifiers which will reliably indicate when a valid sense decision can be made taking into consideration the individual process parameters and operating conditions of the actual memory circuit. Appropriate bias levels are generated by a bias circuit for use in the output buffer according to whether a process temperature and voltage variations within the memory circuit are such that variation sensitive components will be slowed upon the occurrence of such variations. The bias circuit otherwise generates a bias signal appropriate for fast speed operations within the output buffer circuit when process temperature and voltage variations are such that they do not effect circuit speed of sensitive circuit portions. The back bias generator which operates asynchronously from the memory cycle is improved by disabling the charge pumping action during a memory cycle. Output enabling signals are selectively inhibited by a control circuit which determines when the memory cycle is actual completed. Memory circuit operation is further improved by performing a predecode precharge signal to the memory circuit beginning with the detection of an address transition and holding a predecode charge until the memory cycle is begun notwithstanding conflicts which may later occur between address transition detection signals and signals indicative of memory cycle initiation so that inadvertent lockup of the memory cycle is prevented.

The invention is an improvement in a read only memory including an addressable memory. The memory is addressed by an address signal through an input buffer. The improvement comprises a first inverter stage of the input buffer. The first inverter stage has an output and an input coupled to the address signal. A second inverter stage is provided in the input buffer. The second inverter stage has an input coupled to the output of the first inverter stage and has an output for coupling with the memory. A first and second transistor are coupled together in series circuit. The first transistor is coupled to the output of the first inverter stage and the input of the second inverter stage. The second transistor is coupled to ground. The first and second transistors are controlled by corresponding gates. The gate of the first transistor is coupled to the address signal and the gate of the second transistor is coupled to the output of the second inverter stage.

As a result, operation of the input buffer has a hysteresis characteristic substantially independent of noise.

The invention is an address input buffer in an addressable memory circuit addressable by a plurality of address signals. The invention comprises an input of the buffer circuit coupled to one of the address signals. An output of the buffer circuit is coupled to the memory. A circuit establishes a threshold voltage of the input of the buffer circuit when the address signal goes from a low logic level to a high logic level. The threshold voltage is established at a first predetermined level. Another circuit establishes a second threshold voltage at a second corresponding predetermined level when the address signal at the input goes from a high logic level to a low logic level. The second threshold voltage is less than the first threshold voltage so that the threshold voltages of the input of the input buffer circuit operate in a hysteresis loop thereby rendering the address input buffer circuit insensitive to noise.

The input of the input buffer circuit comprises a first inverter stage and the output is a second inverter stage coupled with the first inverter stage. The circuit for establishing the first threshold voltage comprises the first inverter stage and the circuit for establishing the second threshold voltage comprises two transistors coupled in series circuit from the output of the first inverter stage and the input of the second inverter stage to ground. The two transistors each have a gate. The gate of one of the two transistors is coupled to the input of the buffer circuit and the gate of the other one of the two transistors is coupled to the output of the buffer circuit.

The invention is an improvement in a memory circuit including an address transition detection circuit for receiving an address signal to address the memory and for generating an address transition detection signal indicating validity of the address signal. The improvement comprises a latch circuit included within the address transition detection circuit for selectively holding the address signal and, at a predetermined command, for latching a successor address signal. The address transition detection circuit detects a change of state of the address signal. A delay circuit is coupled to the address transition detection circuit and generates the predetermined command signal to the latch circuit in response to detection of address transition from the address transition detection circuit.

As a result, the address state of a preceding cycle is maintained while the address signal is indefinite. As a further result, the new address state is established only after the address is defined therefore avoiding unnecessary power consumption caused by unnecessary switching in the memory circuit.

The latch circuit is not reset to the new address state until expiration of a predetermined time interval defined in part by the delay circuit so that address signals coupled to the address transition detection circuit do not cause output changes during the predetermined time interval.

The delay circuit comprises a delay circuit and transistor circuit coupled to the input of the latch circuit. The transistor circuit receives signals corresponding to the address signals and transmits the corresponding signals to the latch circuit when selectively permitted by a delayed command signal generated by the delay circuit.

The address transition detection circuit comprises a first and second selectively controlled transistor having gates controlled by the output of the latch circuit. The first and second transistor passes the address signal through the transistors to the output of the address transition detection circuit. One of the first and second transistors has the logical complement of the address signal input thereto with the other one of the transistors having the address signal input thereto.

The invention is an improvement in a memory circuit having an array of addressable memory cells organized into blocks or banks of memory cells and including a plurality of diffusion bit lines, virtual ground lines and a main bit fine. Each the diffusion bit lines, virtual ground lines and main bit line longitudinally disposed through the blocks of memory cells. Each block has a first and second end. The diffusion bit lines, virtual ground lines and main bit line are disposed between the first and second end of each block. The improvement comprises a plurality of contacts connected to the virtual ground lines and main bit line at each the end of each block. A ground is selectively coupled to one of the plurality of contacts. A sense amplifier is selectively coupled to the main bit line through one of the plurality of contacts. The ground and sense amplifier are connected to corresponding opposing contacts at each end of each the block. A circuit selectively couples the ground and sense amplifier to selected ones of the virtual ground lines and main bit line in response to address command signals. Access to any one of the memory cells within each block made through the selected virtual ground lines, corresponding bit diffusion lines, main bit line and sense amplifier where the total length of the N+doped diffusion bit line and virtual ground line never exceeds the length of the selected block of memory cells and remains virtually a constant value.

As a result, parasitic capacitance is minimized and fairly constant memory access speed is thereby increased, and the capacity for memory cell density is increased.

Two virtual ground lines are provided and the circuit for selective coupling the virtual ground lines to ground selectively couples one of the two virtual ground lines to ground and the other of the two virtual ground lines to a precharge voltage.

Each of the virtual ground lines and main bit line has a contact connected therewith at opposing ends of each block of memory cells.

Each virtual ground line and main bit line has one of the plurality of contacts connected therewith at each the end of each the block of memory cells so that a circuit path through the contact to the virtual ground line, addressed memory cell, at least one diffusion bit fine and the main bit line is never substantially more than the length of the addressed block of memory cells. No memory cell is further away from the corresponding contact which is connected to the virtual ground fine and main bit line, than approximately one half the length of the block of memory cells.

The invention is also an improvement in a memory circuit having a plurality of addressable memory cells arranged in a plurality of blocks. The plurality of memory cells is logically organized in columns. The memory cells in each column are coupled together by diffusion bit lines. The memory blocks are provided with at least one virtual ground line and a main bit line. The improvement comprises a first circuit for selectively coupling the virtual ground line to the diffusion bit line. The first circuit is coupled to one end of the addressed blocks of memory cells. A second circuit selectively couples a selected one of diffusion bit lines to main bit line. The second circuit is coupled to the opposing end of the addressed block from the first circuit. Access to a selected one of the addressable memory cells requires transmission of a signal on a path including at least one of the diffusion bit lines no greater in aggregate length than the length of the addressed block.

The block of memory cells is comprised of four columns of memory cells. The first circuit is coupled to two of the columns while the second circuit is coupled to the other two of the four columns. Two diffusion bit lines correspond to each column of the memory cells. The first circuit selectively shorts together two corresponding diffusion bit lines corresponding to columns selected by the first and second circuit respectively. An addressable memory cell is read through the main bit line which is selectively coupled to the addressable memory cell through the second circuit with completion of the circuit path through the addressed memory cell through the first circuit to the virtual ground.

The memory circuit is provided with two virtual ground lines symmetrically disposed relative to the main bit line and further comprises a second block of memory cells identical in architecture to the first block of memory cells but laid out with mirror symmetry relative to an imaginary line perpendicular to the virtual ground lines and disposed at one end of the first block of memory cells.

The improvement further comprises contacts with the main bit line and the virtual ground lines. The contacts provided to the first block of memory cells are used in common with the mirror symmetrical second block of memory cells.

In another embodiment the invention is an improvement in a memory comprising a plurality of addressable memory cells arranged in logical columns to form a plurality of blocks of memory cells. Each column has two corresponding diffusion bit lines disposed along the length of the block of memory cells. The memory cells are arranged and configured into four columns with the main bit diffusion line corresponding to the second and third columns of memory cells. The improvement comprises a virtual ground decoder for selectively coupling a first and second one of the diffusion lines to ground. A first circuit is disposed at each end of the blocks for selectively coupling the diffusion bit lines coupled to the virtual ground decoder to an adjacent diffusion bit line. A second circuit is disposed at each end of the blocks for selectively coupling the main bit diffusion line with two adjacent bit diffusion lines. The adjacent bit diffusion lines also are coupled through the first circuit to the virtual ground decoder. The virtual ground decoder is disposed solely at one end of the blocks.

As a result, the length of the circuit path of a signal read from any one of the addressed memory cells through the bit diffusion lines does not exceed in aggregate substantially more than one length of the memory block now is it substantially less.

The improvement further comprises a precharge circuit. The first and second diffusion lines and the main bit line bit diffusion line are each coupled to the precharge circuit. The precharge circuit is disposed at the end of the memory blocks opposing the virtual ground decoder.

The invention is still further a memory circuit comprising a plurality of word lines. A memory block comprises a plurality of addressable memory cells coupled to the word lines. A control circuit is coupled to the memory block for producing a plurality of precharge and control signals for reading the memory block. A word line decoder is coupled to the memory block for providing address signals to the memory block. A dummy word line decoder generates simulative address signals. A first and second dummy word line are electrically simulative to word lines within the memory block. One of the dummy word lines models a previously selected word line within the memory block and the other one of the dummy word lines models a newly selected word line within the memory block. A circuit alternately designates to the dummy word line decoder which one of the first and second dummy word lines models a previously selected word line and which one models a newly selected word line. The circuit is coupled to the first and second dummy word lines. A transition control circuit is coupled to the first and second dummy word lines for determining the transitional time when the dummy word lines have set up a complete and valid address. The transition control circuit is coupled to the control circuit to initiate operation of the control circuit to allow reading of the memory block by the word line decoder depending upon the transition completion as determined by the transition control circuit.

The first and second dummy word lines are constructed to electrically match word lines used within the memory block.

Precharge, timing and control signals generated by the control circuit are initiated by the control circuit in response to determinations made by the transition control circuit as individualized to the memory circuit according to actual observed transition points within the first and second dummy word lines.

The control circuit comprises a dummy memory cell constructed to model memory cells within the memory block. The control circuit determines when a preselected voltage transition point in the output of the model memory cell occurs to determine the time of complete address setup.

The invention is still further an improvement in a memory circuit including an address decoder for providing an address signal to addressable memory cells within a memory array. The address decoder comprises a decoding block having an input for receiving address signals, a prebuffer block coupled to the decoding block, and a buffer block coupled to the prebuffer block for generating decoded output address signal. The improvement comprises a first circuit for selectively coupling the output voltage of the decoding block. A second circuit receives the output voltage from the decoding block from the first circuit and selectively couples the voltage to the input of the buffer block when the buffer block is enabled for output.

The first circuit and second circuit selectively couple the output voltage of the decoding block to stabilize the buffer block and avoid emission of hot electrons.

The invention is an improvement in a sense amplifier in a memory circuit having an array of addressable memory cells. The sense amplifier reads the output from the memory array. The improvement comprises a differential amplifier and first and second dummy bit lines. A first and second plurality of dummy memory cells, which are each capable of being selectively programmed into an ON or OFF state, are provided. Each dummy memory cell is electrically similar to the memory cells in the array. The first plurality of dummy memory cells is coupled to the first dummy bit line and is programmed into the ON state. The second plurality of dummy memory cells is coupled to the second dummy line and is programmed into the OFF state. A main bit line is coupled to the memory cells in the array. An addressed one of the memory cells is selectively coupled to the main bit line. A buffer has an input coupled to the main bit line and an output coupled to the differential amplifier. An averaging buffer has an input coupled to the first and second dummy bit lines and an output coupled to the differential amplifier. The differential amplifier amplifies the difference between the output of the buffer and the averaging buffer.

As a result, leakage current in the memory circuit is uniformly applied to the main bit line and to the first and second dummy bit lines so that dependence on the leakage current in the output of the sense amplifier is eliminated.

The first plurality of dummy memory cells is disposed within the memory circuit in a region where word line voltage within the memory circuit is at its maximum level.

The second plurality of dummy memory cells is disposed within the memory circuit in a region where word line voltage will be a minimum.

The averaging buffer produces at its output a voltage which is substantially the arithmetic average of the voltage on the first and second dummy bit lines. The arithmetic average is substantially equal to sum of the average voltage between the ON and OFF state of the memory cells within the memory array and the leakage voltage within the memory circuit.

The invention is an improvement in a memory circuit having a plurality of addressable memory cells including a trigger circuit for sensing the contents of the memory cells. The improvement comprises a first and second dummy word line. A first and second plurality of dummy memory cells are coupled to the first and second dummy word lines respectively. The dummy memory cells are each capable of being selectively programmed into an ON state or OFF state. The first plurality of dummy memory cells is preprogrammed to the ON state and the second plurality of dummy memory cells is preprogrammed to the OFF state. A sensing stage circuit detects the difference in potential between the first and second dummy word lines. The sensing stage circuit is coupled to the first and second dummy word lines.

The memory includes output drivers and the sensing stage circuit determines when there is enough current in the first and second dummy word lines to latch data and to turn on the output drivers within the memory circuit.

The memory circuit further includes a sensing stage and wherein the sensing stage has an input which electrically emulates the input of the sensing latch.

The improvement further comprises a sense amplifier coupled to the memory cells. The sensing stage determines the amount of current drive received from the first and second dummy word lines which is required before the sense amplifier is allowed to make a decision as to the contents of the addressed memory cell.

The improvement further comprises an amplifier circuit having its input coupled to the output of the sensing stage circuit and having an output for generating the amplified difference of the voltage on the first and second dummy word lines. A level detect circuit has an input coupled to the output of the amplifier circuit. The level detect circuit converts the output of the amplifier circuit to a preconditioned signal. An inhibit circuit prevents false triggering during a nonsensing time period when a predetermined precharge signal is active.

The memory cells are organized into blocks of memory cells in a memory circuit having an memory array with a plurality of addressable memory cells. The invention is an improvement wherein each block of memory cells is provided with a virtual ground line and main bit line. A low address Y decoder circuit selectively couples the virtual ground line and main bit line of a selected block of the memory array. A high address Y decoder circuit selects a subportion of the selected block. The high address Y decoder circuit is coupled to the low address Y decoder circuit. The output of the high address Y decoder circuit is provided as an output bit signal of the addressed memory cell within the memory array. A bit precharge circuit charges a selected main bit lines of the memory array to be coupled with the sense amplifier. A blanket precharge circuit charges all main bit fines and virtual ground lines within the memory array to a predetermined precharge level. A bank precharge circuit selectively couples together the virtual ground lines and main bit line within a selected block of memory cells so that previous data from any previously selected memory cells within the block is eliminated and the main bit lines and virtual ground line within the selected block are equally precharged with a predetermined precharge level.

The improvement further comprises a bit fine, and a sense amplifier coupled to the memory array by the bit fine. The bit precharge circuit precharges the bit line coupled to the input of the sense amplifier even when the bit line coupled to the sense amplifier is not selected, thereby improving speed of the sense amplifier when the bit line is in fact selected and protecting the sensing amplifier from switching noise within the memory cycle.

The blanket precharge circuit simulates a static precharge of all the main bit lines of the memory array.

Each of the blocks of memory are organized into banks and the bank precharge circuit precharges all bit lines within the selected block of memory cells including nonselected banks of memory cells within the block to eliminate the effect of any preceding memory cycle and prepare the block for a new memory cycle and to suppress bit line delay.

The invention is an improvement in a memory circuit having a memory array with a plurality of addressable memory cells. The memory cells are read by a biased sense circuit. The improvement comprises an output inverter stage having a drive transistor controlled by a gate. The output inverter stage generates a bias voltage applied to the sense circuit. A compensation inverter has a plurality of drive transistors for conducting a drive current through the compensation inverter responsive to variations in process parameters and operating conditions. The compensation inverter has an output coupled to the gate of the drive transistor of the output inverter so that the sense amplifier is biased in response to the variations in process parameters and operating conditions.

The plurality of drive transistors in the compensation inverter electrically simulate the memory cells within the memory array in terms of device parameters and operating conditions.

The invention is an improvement in a memory circuit having a memory array with a plurality of addressable memory cells including a sense amplifier for reading the contents of the addressable memory cells. The invention comprises a first and second dummy bit line. A corresponding first and second plurality of dummy memory cells coupled to the first and second dummy bit lines respectively. A bit line is selectively coupled to an addressable one of the memory cells within the memory array. A dynamic latch is provided. An averaging circuit is coupled to the first and second dummy bit lines for averaging the voltage on the dummy bit lines and coupling the voltage to the dynamic latch. The bit line is also coupled to the dynamic latch. The dynamic latch latches to a logic state depending on whether the logic level on the bit line is higher or lower than the average of the logic levels on the first and second dummy bit lines. The dynamic latch latches to a high logic level when the bit line is at a higher logic level than the average of the logic levels on the first and second dummy bit lines. The dynamic latch latches to a low logic level if the logic level on the bit line is lower than the average logic level on the first and second dummy bit lines. First and second buffer circuits are coupled to the dynamic latch for coupling the latched state of the dynamic latch to an output.

The improvement further comprises a circuit for disconnecting the dynamic latch from the memory cells of the memory array during a predetermined addressing time interval so that the dynamic latch is insensitive to noise occurring outside the predetermined addressing time interval.

The invention is an improvement in a memory circuit having a memory array including a plurality of addressable memory cells and an output buffer for generating an output signal corresponding to an addressed one of the memory cells at an output. The improvement comprises a buffer circuit for receiving a data signal derived from the memory array and for generating an output data signal from the memory circuit. A control circuit is coupled to the buffer circuit and changes the current of the output data signal by a plurality of steps so that peak current is controlled to suppress instability of ground voltages at the output of the buffer circuit.

The control circuit comprises a bias circuit for generating a two-step bias voltage. The bias circuit is coupled to the buffer circuit. The buffer circuit comprises a drive circuit coupled between the output and ground. The bias voltage is applied to the drive circuit to connect the output to ground at a first level of conduction and after a predetermined time delay at a second level of conduction so that current flowing from the output to ground is provided in two steps.

The invention is an improvement in a memory circuit having a memory array comprising a plurality of addressable memory cells including a bias circuit for generating a bias voltage for use within the memory circuit for setting of operating points of circuits therein. The improvement in the bias circuit comprises an RC delay circuit for generating a timed delay. The RC delay circuit has an input coupled to a memory circuit enable signal input. A gate delay circuit generates a time delay based on average gate performance within the memory circuit. The gate delay circuit has an input coupled to a memory circuit enable signal input. A latched logical compare circuit is coupled to the RC delay circuit and gate delay circuit. The latched logical compare circuit compares the delayed signals from the RC delay circuit and gate delay circuit, and determines which is first in time. The latched logical compare circuit latches to a distinguishable state depending upon which of the delay signals from the RC delay circuit and gate delay circuit is first in time. A switching circuit generates a bias potential depending upon the state of the latched logical compare circuit.

The RC delay circuit is comprised of a plurality of capacitors and resistors and is substantially independent of process, temperature and voltage variations. The gate delay circuit comprises a plurality of inverters constructed to be representative of the general circuit speed within the memory circuit.

The gate delay circuit is constructed to model portions of the memory circuit whose speed of operation is affected by variations in temperature and voltage.

Among the circuits in the memory circuit is an output buffer circuit. The switching circuit provides a bias voltage to the output buffer circuit at a voltage level sufficient to reduce noise within the output buffer circuit.

The invention is an improvement in a memory circuit having a memory array including a plurality of addressable memory cells. The memory cells are addressed in a memory cycle. The improvement comprises an oscillator for generating a clock signal. A buffer receives the clock signal and generates a predetermined buffered signal in response. A charge pump receives the buffered clock signal and generates a back bias voltage for use within the memory circuit. A circuit selectively disables the oscillator to prevent generation of the clock signal upon a predetermined logical condition. The circuit disconnects the oscillator from the buffer during the memory cycle.

The invention is an improvement in a memory circuit having a memory array and a plurality of addressable memory cells within the array. The improvement comprises a back bias generator for generating a back bias voltage coupled to the substrate in which the memory circuit is disposed. A circuit is provided for inhibiting generation of the back bias voltage during the memory cycle.

The invention is an improvement in a memory circuit having a memory array and a plurality of memory cells within the memory array, further including a sense circuit for reading the contents of an addressed one of the memory cells and an output buffer coupled to the sense circuit to generate a data output signal from the memory circuit. The improvement comprises a first circuit for generating a first state when an address transition is detected within the memory circuit and for generating a second state when the sense amplifier has completed reading of an address memory cell. A second circuit resets the first circuit in the second state after the sense amplifier has completed reading the addressed memory cell. A third circuit inhibits a memory circuit enable signal until the first circuit has determined that a memory cycle is complete by detection of the address transition followed by completion of the sense amplifier reading of the address memory cell.

The invention is an improvement in a memory circuit having a memory array comprising a plurality of addressable memory cells including a memory control circuit for controlling operation of the memory circuit in response to address changes. The improvement comprises a first circuit for storing a signal indicative of the fact that an address transition has occurred within the memory circuit. The first circuit generates a predecode precharge signal to initiate a memory cycle within the memory array. A second circuit is coupled to the first circuit. The second circuit inhibits any additional latching action of the first circuit after the memory cycle is begun and until the memory cycle is completed.

The first circuit comprises a latch set by any one of a plurality of address transition detection signals provided by the memory circuit thereto.

The second circuit is a latch to inhibit any latching of the first circuit after initiation of the memory cycle following receipt by the first circuit of the address transition detection signal from the memory circuit until completion of the memory cycle as determined by the control circuit so that lockup of the first circuit is prevented regardless of conflict between receipt of the address transition detecting signals and the beginning of the memory cycle.

The various embodiments of the invention can better be visualized and understood by turning to the following drawings wherein like elements are referenced by like numerals.

BRIEF DESCRIPTION OF THE DRAWINGS

FIG. 5 is a schematic diagram showing an address transition detection circuit of the invention.

The invention and its various embodiments can now be better understood by turning to the following detailed description.

DETAILED DESCRIPTION OF THE PREFERRED EMBODIMENTS

The invention comprises a memory cell array formed by a plurality of memory cells which are divided into blocks. The memory cells are symmetrically patterned with respect to conductive lines which connect junctions between the memory cell blocks and a main bit line. The conductive lines are perpendicular to the main bit line. The pattern is constructed such that the virtual ground line contact is at one end of the block and contact to the main bit line at the other side of the block. The path through the memory array element traveling along the diffusion bit line is not substantially more nor substantially less than the height of the block being addressed.

The invention further includes an input buffer circuit having a threshold voltage of its initial inverter stage controlled by a driving transistor.

The invention also comprises an output buffer circuit in a ROM which includes a two-stage circuit for controlling current flowing from an output pin into the ground.

The invention comprises a sense circuit including means for adjusting loads in response to the driving signal from the memory cells.

Figure 1:
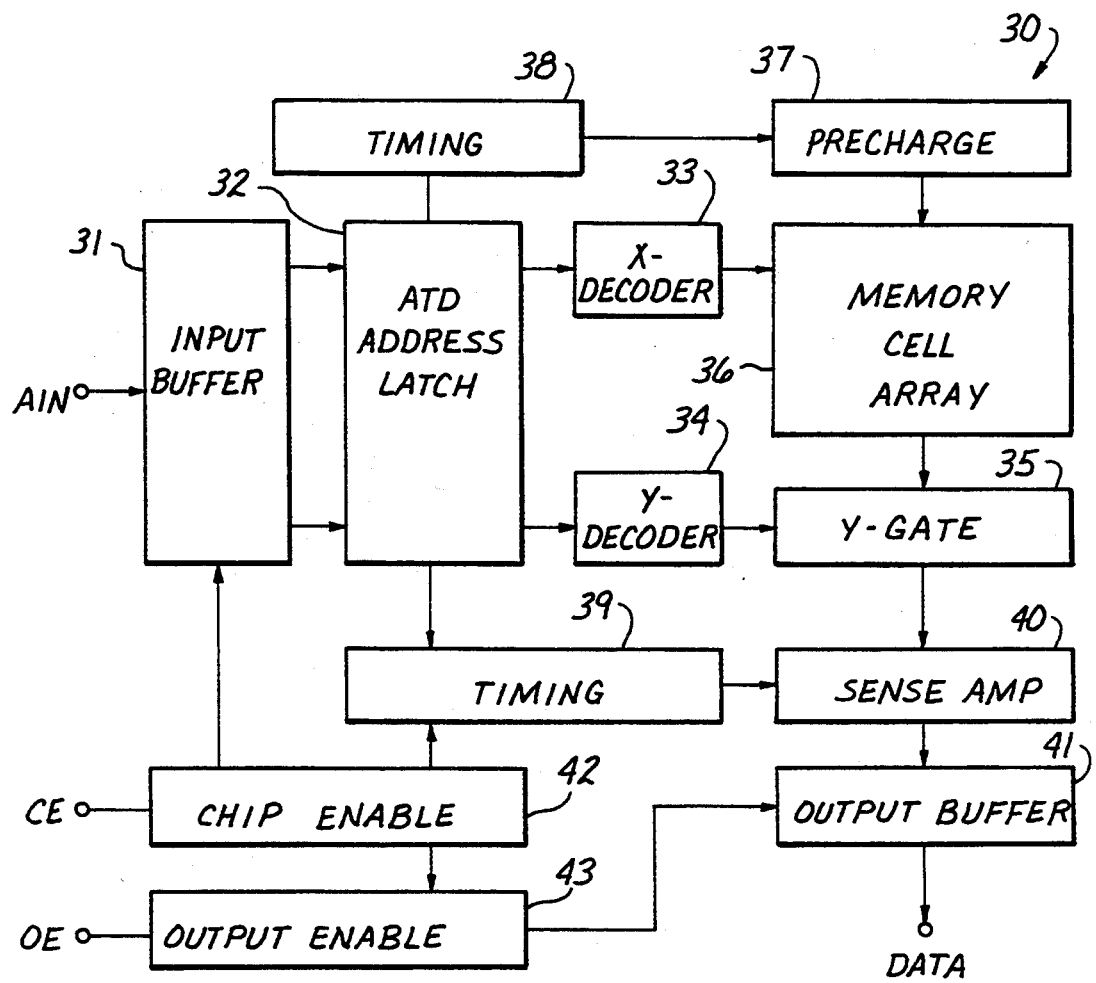
FIG. 1 is a block diagram showing a typical read only memory architecture in which the invention is embodied.

Turn now to the block diagram of FIG. 1, wherein a typical read only memory, denoted by reference numeral 30, is depicted. An address input signal, AIN, is coupled to an input buffer 31 and converted from TTL level logic to the logic levels required within memory 30. An address detection circuit and latch 32 detects the transition of the address signal and produces appropriate timing signals which are coupled to timing circuitry 38 and 39.

The address signal is coupled through ATD 32 to X decoder 33 and Y decoder 34. The bit lines of a memory cell array 36 are precharged by a precharge circuit 37 controlled by timing circuit 38. A memory cell is selectively accessed within memory array 36 by X decoder 33 and a Y gate select circuit 35. Y gate select circuit 35 in turn is controlled by Y decoder 34. The output of the accessed memory cell is coupled to sense amplifier 40. Sense amplifier 40 detects voltage levels on the precharged bit lines according to whether a 1 or a 0 is stored in the memory cell. Timing circuit 39 is coupled to and controls sense amplifier 40. The output signal from sense amplifier 40 is coupled to output buffer 41 whose output in turn is the data signal, Q and its logical complement, Q-. Throughout this specification the "-" suffixed to a signal symbol designates the logical complement of the signal. Discrete control commands, such as chip enable, CE, are coupled through chip enable circuit 42 which in turn controls input buffer 31, timing circuit 39 and an output enable circuit 43. Output enable circuit 43 is also responsive to an external control signal OE, output enable. Output enable circuit 43 is connected to and controls output buffer 41.

Figure 2:
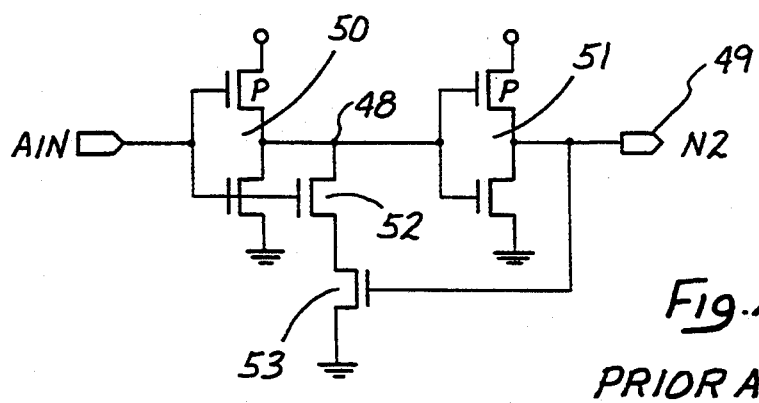
FIG. 2 is a schematic of an input buffer circuit incorporating the invention.

Turn now to FIG. 2, which is a schematic diagram of a first embodiment of an input buffer such as input buffer 31 of FIG. 1. Only one bit is illustrated in FIG. 2 and it must be understood that the circuit of FIG. 2 is replicated as many times as there are input address bits. An address input bit, AIN, is coupled to a first inverter 50 whose output is coupled to a node 52. The input of a second inverter 51 is coupled to node 48. Node 48 in turn is coupled to the input of a second inverter 51. The signal from the output of inverter 51 is fed back to an NMOS transistor 53. The input to inverter 50 is also coupled to the gate of an NMOS transistor 52. Transistors 52 and 53 are in series between node 48 and ground.

When the address input signal AIN is at a low logic level, the voltage at node 48 is high and at output 49 low. The low logic output voltage is supplied back to the gate of transistor 53 which is thus held in the off or in nonconductive state.

When address signal AIN goes to a high logic level, it must exceed a threshold voltage VT1 which is determined by the characteristics of inverter 50 before the voltage at node 48 inverts. See curve 47 in FIG. 3. When AIN is at a high logic level, the voltage at node 49 is also high thereby turning transistor 53 on or making it conductive. Transistor 52 is also turned on by the high input from AIN thereby pulling node 48 to ground in parallel with inverter 50.

Now when the address input, AIN, switches to a low logic level from a high logic level, the address input must be less than the threshold voltage VT2 which will be determined according to the operating characteristics of inverter 50 and transistors 52 and 53. See curve 45 in FIG. 3. The threshold voltage VT2 as set by inverter 50, and transistors 52 and 53, is lower than the threshold voltage VT1 which is determined by inverter 50 alone since the driving force to inverter node 48 is increased by transistors 52 and 53.

Once the address signal AIN goes low, the threshold voltage is raised from VT2 to VT1. As a result, node 49 is stably maintained at a lower logic level even if the address input is thereafter subjected to noise. First the threshold voltage is raised from VT2 to VT1 through reduction in the driving force applied to node 48. The amount of the shift of the threshold voltage can be insured since transistor 52 will not be turned on even if the noise caused in the LSI itself is increased notwithstanding a large transconductance $g_m$ of the driving circuitry coupled to node 48.

Figure 3:
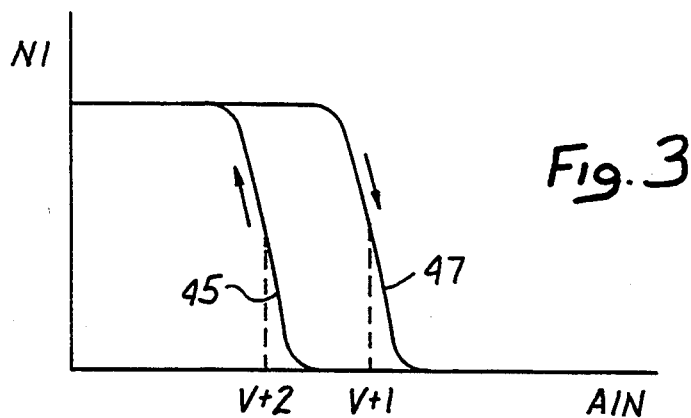
FIG. 3 is a graph of the operating voltages of the circuit of FIG. 2.

The performance of the circuitry of FIG. 2 is summarized in the operational graph of FIG. 3. The voltage level on node 48 is depicted in the vertical scale while the voltage level of the address input signal is illustrated on the horizontal scale. The threshold voltages are taken at the approximate half way points of the two logic states of node 48. What results is a hysteresis shaped curve. The arrows associated with curves 47 and 45 indicate the circuit performance which will be produced depending upon whether node 48 is being switched from high to low or from low to high as symbolically denoted by the arrows in FIG. 3. For example, if node 48 is in a high state it will switch to a low state only on curve 47 characterized by the higher voltage VT1. Once node 48 is in a low state it will then switch back to the high state again only on curve 45 characterized by the lower threshold voltage VT2.

Figure 4:
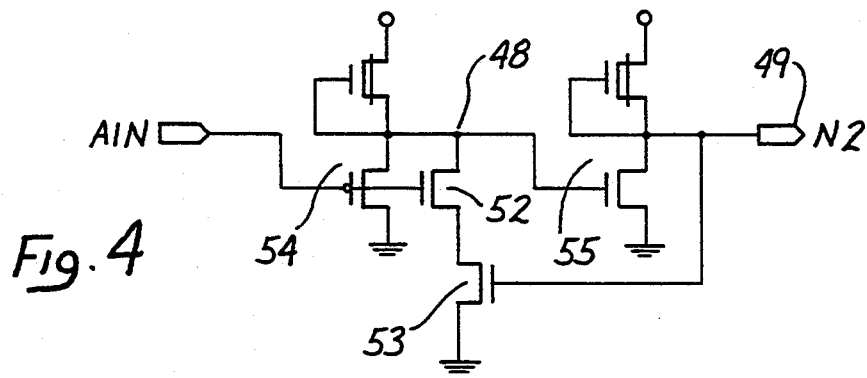
FIG. 4 is a circuit diagram showing another embodiment of an input buffer incorporating the invention.

Turn now to FIG. 4 wherein a second embodiment of input buffer 31 is depicted. Whereas the inverters 50 and 51 of the input buffer of FIG. 2 were comprised of a PMOS and NMOS transistor, the circuit of FIG. 4 is comprised only of NMOS transistors. Depletion type NMOS transistors are employed as the load transistor for inverters 54 and 55 which comprise the first and second stages of the input buffer respectively. The circuit topology of the input buffer of FIG. 4 is otherwise identical to that shown in FIG. 2 and the operation is analogous.

Turn now to FIG. 5 which is a schematic of the address transition detector (ATD) 32 of FIG. 1. In the upper portion of the diagram a single bit line A0 is shown coupled to the depicted circuitry. This circuitry is replicated for each bit line as symbolically denoted by box 56. ATD circuit 32 generates internal address signals AA0 and AA0-. The buffered address bit from input buffer 31 is coupled through a first inverter 60, a gate transistor 61 to a second inverter 63 to produce the address transition discrimination signal, ATD-. The address bit is also coupled directly through a gated transistor 62 to inverter 63.

The signal A0 is provided to the gate of transistor 64. Transistor 64 has one terminal coupled to ground and its output coupled to the input of transistor 66. Transistor 66 is controlled by a timing signal, sample address, SMPA, or by the output of delay circuit 73, which has a constant delay with respect to the ATD- signal as determined by inverter 72 and delay circuit 73. A0- from inverter 60 is similarly provided to the gate of transistor 65. Transistor 65 in turn is coupled in series with transistor 67 whose gate is also controlled by the output of delay circuit 73. The output of transistors 66 and 67 are provided to the inputs of a flip-flop comprised of transistors 68–71. Transistors 68 and 70 are depletion load transistors with corresponding series driving transistors 69 and 71 being coupled to ground. The internal address signals AA0 and AA0- then are provided respectively to the gates of transistors 61 and 62 to gate through a change of the address bit A0 or A0- as ATD-.

Figure 6:
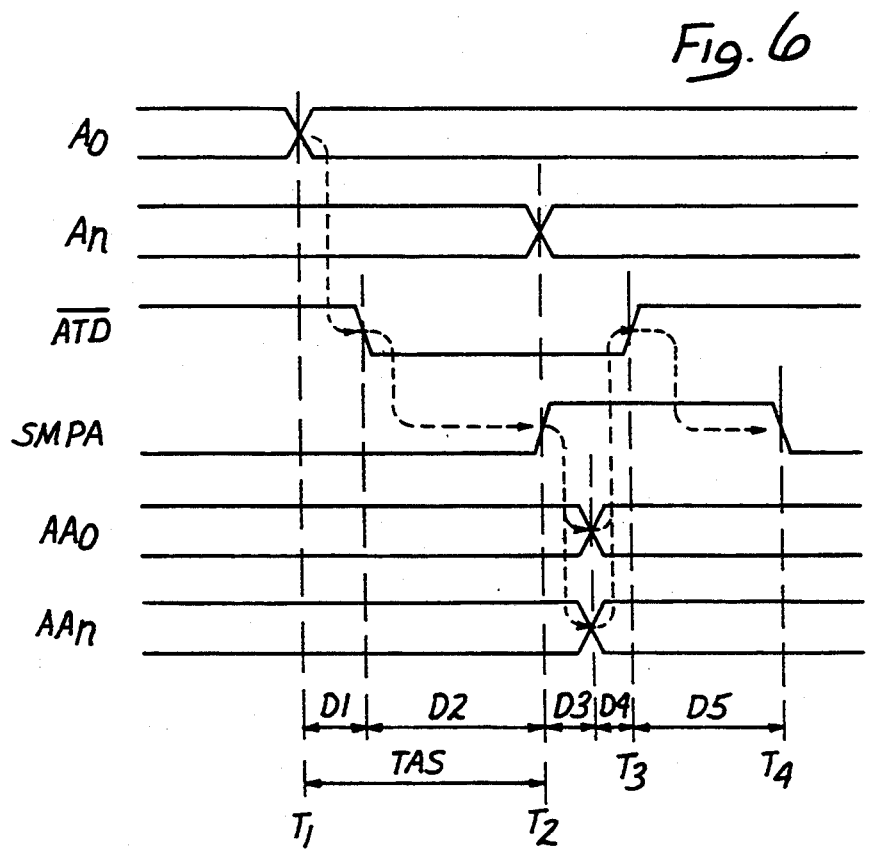
FIG. 6 is a timing diagram of the circuit of FIG. 5.

Consider now the operation of the circuit shown in FIG. 5 as summarized by the timing diagram of FIG. 6. Assume that the address A0 is at a low logic level. AA0 will be low, AA0- will be high, ATD- will be high due to the circuit connections in FIG. 5 and the output of delay circuit 73, which is an internally generated timing signal, is low and as shown by the signal relationships of FIG. 6. When address A0 goes high at a transition point T1, shown in FIG. 6, signal ATD- goes low since transistor 62 is in a conductive state. The internal address signals AA0 and AA0- do not change state at this time as shown in FIG. 6 because the output of delay circuit 73 is still held low leaving the blocking transistors 66, 67 nonconductive.

After a lapse of a delay time D2 following the transition of ATD- as shown in FIG. 6, the output of delay circuit 73 goes high at time T2 as determined by delay circuit 73. Blocking transistors 66 and 67 will now be rendered conductive and the flip-flop 68–71 will change state. This occurs after a switching delay time of D3 after T2. Transistor 61 will now be turned on and transistor 62 turned off. This now causes ATD- to go high after a delay D4 at time T3 as illustrated in FIG. 6. After a further delay time of D5 the change of state of ATD- is coupled through inverter 72 and delay circuit 73 and the output of delay circuit 73 again goes low at time T4. This is then the operation of a single change in logic level of an address bit.

Even if the difference in address timing between the first address bit to be changed, assumed here to be A0, and the last address bit to be changed, assumed to be AN, is as large as the time interval TAS shown in FIG. 6, internal address signals AA0 and AAN will nevertheless transition at the same time, namely between T2 and T3 in synchronization with the leading edge of the output of delay circuit 73. Synchronization occurs as long as delay circuit 73 is set so that the delay time D2 is at least as great as the difference between TAS and D1. It should also be specifically understood that the NMOS circuit structure of FIG. 5 can be replaced by an equivalent CMOS structure without departing from the spirit and the scope of the invention.

As a result of an ATD circuit of this design, the address state of a preceding cycle is maintained during the time period when the address signal is indefinite. The new address state is established only after the address is defined and therefore unnecessary power consumption caused by unnecessary switching of internal circuitry is avoided.

Figure 7:
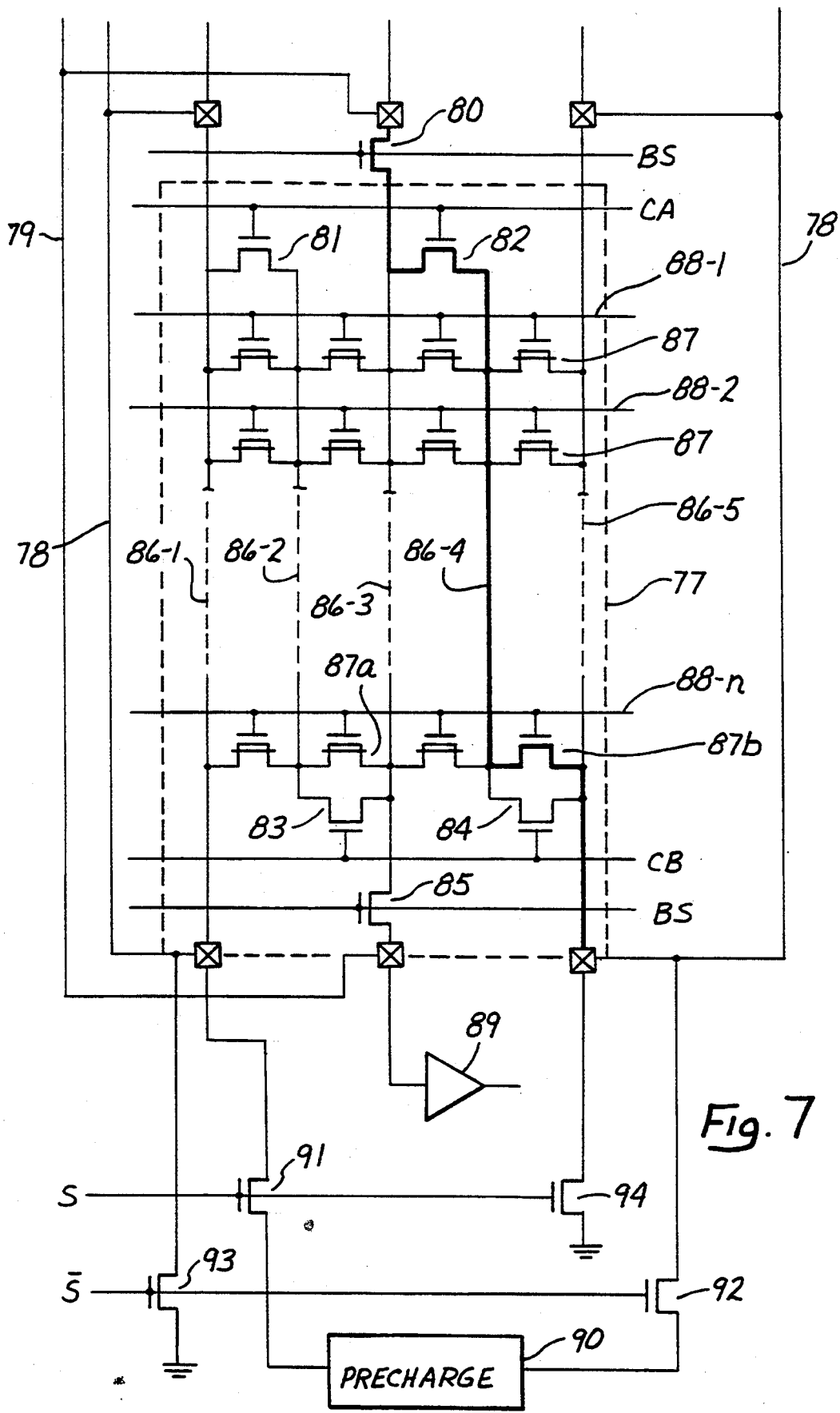
FIG. 7 is a schematic diagram showing a memory cell array incorporating the invention.

Now having considered the invention as embodied in the input buffer 31 and ATD circuit 32 of FIG. 1, consider the improvement of memory cell array 36 as depicted in greater detail in the schematic of FIG. 7. A portion of memory cell array 36 is illustrated in FIG. 7 showing a plurality of bit lines 86-1 through 86-5 which are shown as vertical lines in FIG. 7 which are formed from diffusion layers and word lines 88-1 through 88-n which are shown as horizontal lines in FIG. 7 and formed of polysilicon or polycide. The memory cells are comprised of a plurality of memory cell transistors 87. The block of memory cells is denoted by reference numeral 77.

In the illustrated embodiment a block select transistor 80 shown in the upper portion of the schematic and block select transistor 85 is shown in the lower portion of the schematic, which are connected in series with a center bit line 86-3. Transistors 80 and 85 for each block are coupled together through contacts as shown in FIG. 7 and through the contacts by overlying metal line 79. Diffusion bit lines 86-1 and 86-5 for each block are also coupled together at their ends by overlying metal lines 78. NMOS column select transistors 81-84 are coupled between adjacent bit lines and gated by a column A or column B select signal CA and CB, respectively. For example, column select NMOS transistor 81 is coupled between bit lines 86-1 and 86-2. Column select transistor 83 is coupled between bit line 86-2 and 86-3 and so forth. Therefore, it can be readily seen from the diagram that column select signal CA will short out all the memory cells in the first and third columns, while column select signal CB will short out all the memory cells in the second and fourth columns. The center bit line, 86-3, which is provided with block select transistors 80 and 85, is connected to an aluminum line which in turn is connected to the input of a sense amplifier 40 of FIG. 1.

Each of the bit lines 86-1 through 86-5 are selectively precharged through a precharge circuit 90 through NMOS transistors 91 and 92 and selectively grounded through NMOS transistors 93 and 94. Transistors 91 and 94 are driven by a select signal S, while the complement S- drives discharge transistors 92 and 93.

Consider now the operation of the memory array shown in FIG. 7. In particular, focus your attention upon memory cell 87a shown in the second column near the center of the schematic. A block select signal, BS, is coupled to the gates of transistors 80 and 85 for block selection. This block of memory cells can now be connected through center bit line 86-3 to sense amplifier 40 of FIG. 1 as described below.

The column select signal, CA, then goes high turning on column select transistors 81 and 82 to short out the first and third columns of the memory array and hence select for readout from the second and fourth columns. The column select signal, CB, is maintained at a low logic level.

Figure 17:
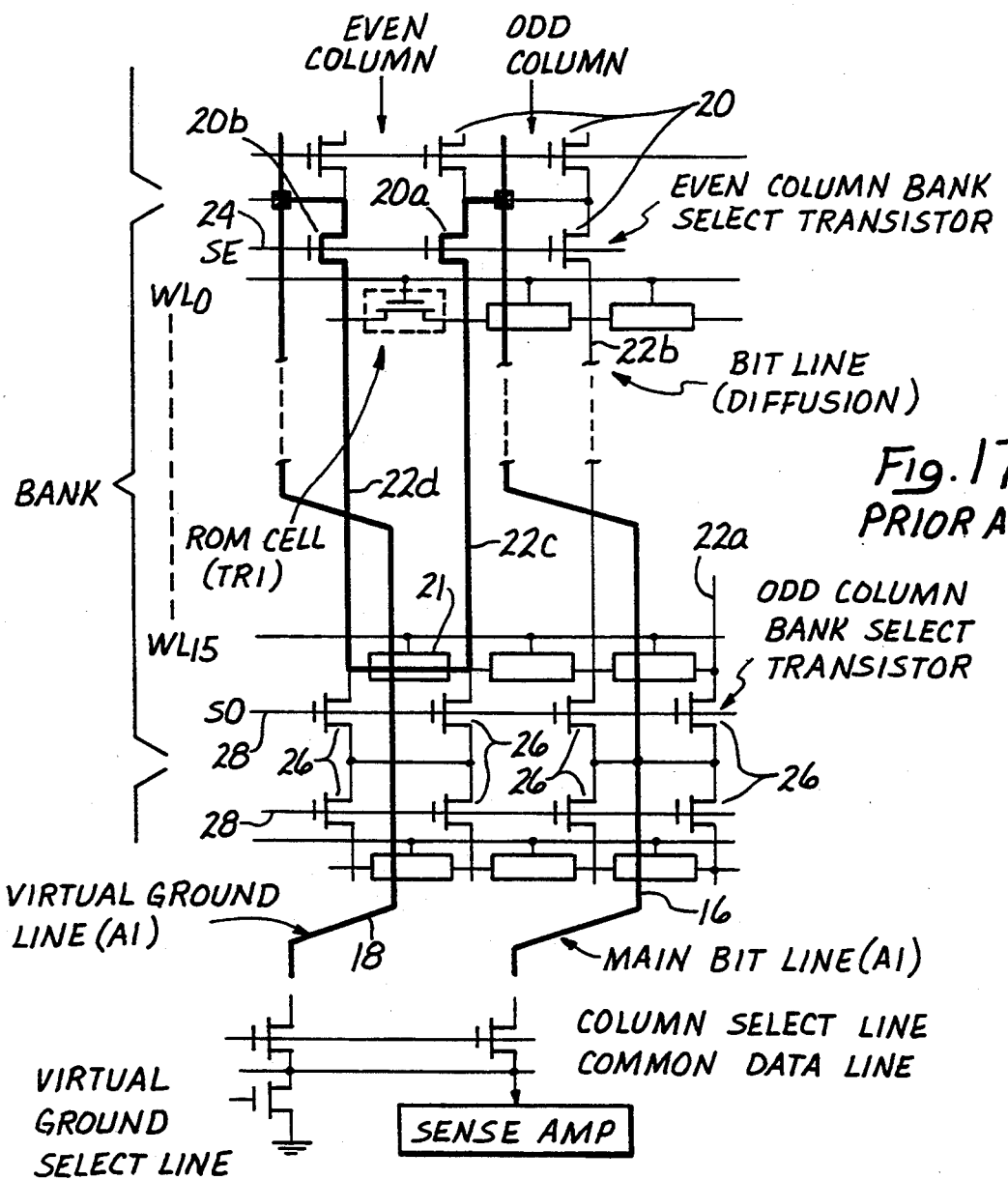
FIG. 17 is a schematic diagram of a prior art memory cell array.

Word line 88-n then goes high, thereby selecting each of the memory cells in the nth row, or in this example the memory cell 87a in the second column and 87b in the fourth column. In order to read out the contents of memory cell 87a, bit line 86-1 is pulled to ground by controller transistor 93 and a precharge applied to bit line 86-5 through controller transistor 92. This is accomplished by forcing the select signal S to go low and its complement S- high. Sense amplifier 40, whose input is precharged, is a low level seeking amplifier and therefore only reads out the contents of memory cell 87a. Comparison of the signal path of the memory array of FIG. 7 to that of FIG. 17 illustrates that in the worst case, the transmission of data signal along the diffusion or bit lines is half as long in FIG. 7 for arrays of the same size as the current path is always top to bottom, or bottom to top, but never top to farthermost cell (bottom) and back to top as in FIG. 17.

Figure 8:
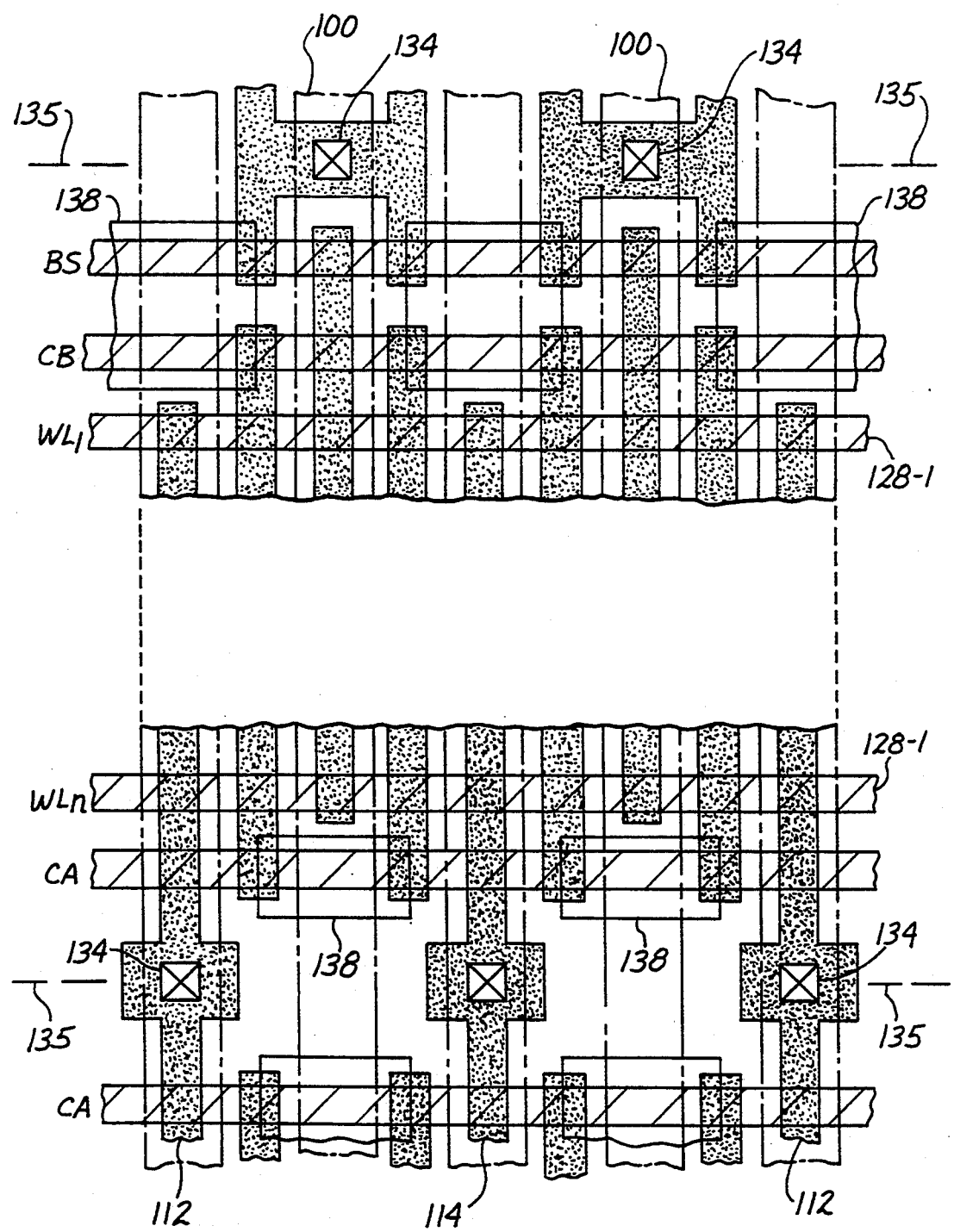
FIG. 8 is a plan view of the diffusion and wiring pattern in an integrated circuit chip showing another embodiment of a memory cell array incorporating the invention.
Figure 9:
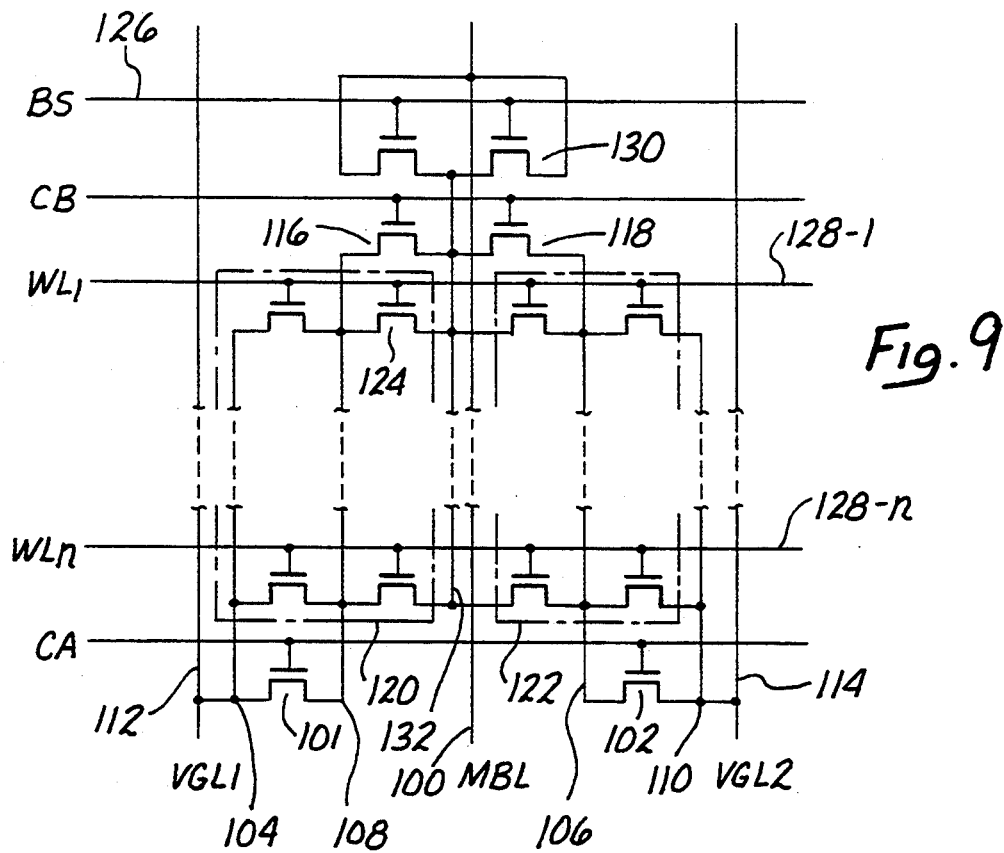
FIG. 9 is a circuit diagram of the memory array shown in FIG. 8.

An alternative embodiment of the memory cell array is shown in the plan view layout of FIG. 8 and in the schematic of FIG. 9. As shown in schematic FIG. 9, main bit line 100 is coupled through NMOS transistors 130 to a center bit line 132. A plurality of pairs of memory cells 124 are then coupled between center bit line 132 and a first virtual ground 112 and a second virtual ground 114. Two memory cells 124 coupled in series with each other form a pair and the pairs coupled in parallel between center line 132 to virtual grounds 112 and 114. The gates of memory cells 124 are coupled to word lines 128-1 through 128-N. Column select NMOS transistors 116 and 118 are coupled in parallel with N memory cells on each side of center bit line 132. Column select NMOS transistors 101 and 102 are coupled in parallel with in N memory cells which are connected to virtual ground lines 112 and 114.

Referring to FIG. 9, a column select signal, CA, is converted to a logic high level in order to select memory cells (second and third columns) immediately adjacent to a main bit line 100 shown in the middle of the schematic FIG. 9. Column select signal, CA, turns on transistors 101 and 102 to short lines 104 and 106 to lines 108 and 110, respectively. Lines 104 and 110 in turn are coupled to virtual ground lines 112 and 114, respectively, VGL1 and VGL2.

Meanwhile, column select signal, CB, shorts lines 106 and 108 to main bit line 100 through transistors 116 and 118, respectively. In other words, signal CA will select the second and third columns while column select signal, CB, will select the first and fourth columns, the columns being ordered and numbered from left to right in the array of FIG. 9.

All left block cells, denoted by dotted outline 120 are selected by converting virtual ground line 112 to a logic low level and setting virtual ground line 114 to the same potential as main bit line 100. In such an instance, the cells within block 120 as opposed to the symmetrically disposed block of memory cells 122 could be read out while those in block 122 could not.

In order to select, for example, cell 124, bit select signal, BS, on bit select line 126 goes to a logical high selecting the block shown in FIG. 9, namely blocks 120 and 122. Signal BS on line 126 is coupled to the gates of transistors 130 which in turn selectively couple main bit line 100 to a center bit line of the array 132. Column select signal, CA, to a logical high, and column select line, CB, to a logical low thereby selecting the second and third columns. Virtual ground line 112 goes to a logical low, and virtual ground line 114 to the level of main bit line 100 thereby selecting the second row. Word line 128-1 to a logical high with each remaining word lines 128-2 to 128-N to a logical low thereby reading cell 124.

Referring specifically to FIG. 8, word lines 128-1 to 128-N and lines for supplying the column select signals, CA, CB and BS, are polysilicon wires. Bit lines 104, 108, 132, 106 and 110 are N diffusion wires while main bit line 100 and virtual ground lines 112 and 114 are metal wires of aluminum. The metallic contacts are denoted by the x-ed squares denoted by reference number 134. Regions 138 denote ion-implanted regions. Threshold voltages in ion-implanted regions 138 exceeds the supply voltage so that NMOS transistors disposed in regions 138 are not turned on even if the gate voltage goes to a logic high.

In each of the embodiments shown in both the embodiments of FIGS. 7 and 9, the metal contacts 134 connecting the diffusion wiring to main bit line 100, and metal contacts 134 connecting the diffusion wiring to virtual ground lines 112, 114 are positioned at opposite ends of the memory cell blocks as best depicted in FIG. 8. Therefore, the resistance of the diffusion wiring elements remains constant regardless of the position of the selected memory cell because the resistance corresponds to the distance between the metal contacts 134. Therefore, as compared to the conventional prior art memory cell array as shown in FIG. 17, wherein the resistance is twice the distance between the contacts, the number of memory cells disposed within any one block can be doubled in the present embodiment with the same diffusion resistance. This allows the degree of integration to be increased relative to the resistance limitations imposed by prior art structures.

Since the contacts between main bit line 100 and memory cell blocks aee positioned on the ends of the memory cell block as shown in FIG. 8. The memory layout can be designed so that the memory cell blocks are mirror symmetrical about line 135 with respect to transverse or horizontal lines (not shown) connecting contacts 134. As a result, the number of contacts can be reduced by fifty percent as compared to conventional layout.

As a further consequence the capacitance and leakage current parasitic to main bit line 100 can also be reduced by fifty percent, thereby increasing switching speeds.

Figure 18:
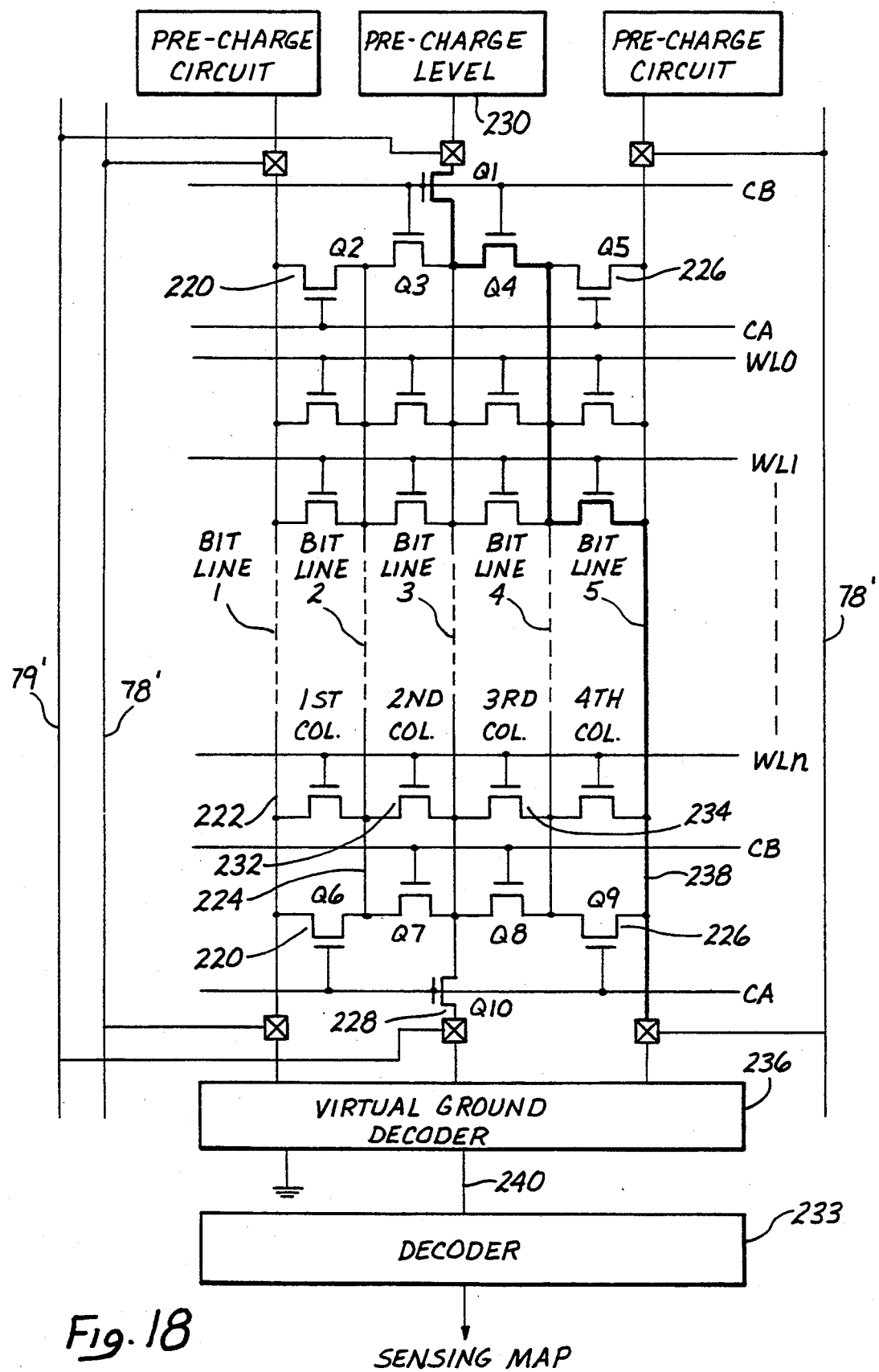
FIG. 18 is a schematic diagram of another memory cell array incorporating the invention.

Another embodiment of the memory array of the invention is depicted in FIG. 18. Like the embodiment of FIG. 7, the embodiment of FIG. 18 includes contacts at each end of the memory block which are connected together with overlying metal lines 79' and 78' having the same function in FIG. 18 as the corresponding lines 78 and 79 have in FIG. 7. Consider, for example, access to a memory transistor at the second column and nth row. Selection signal, CA, goes to a logical high. Thus, transistors 220 at each end of the block are turned on and bit lines 222 and 224 are shorted together. Transistors 226 at each end of the block are also driven on by the select signal, CA, so that bit lines 4 and 5 are shorted together. The first and fourth columns, for example, are shorted together at each end of the array. Transistor 228 is similarly turned on and bit line 231, and middle bit line 240 precharged by precharge circuit 230.

Now the nth word line, WLn, is pulled high, pulling the gates of transistors 232 and 234 high. At this time if virtual ground decoder 236 is set to select bit line 222 by selectively coupling it to ground while maintaining bit line 238 high, the contents of memory cell 232 can be read through center bit line 240 by a bit line decoder 233. Bit line decoder 233 will select one of many block inputs on lines similar to middle bit line 240 from other identical memory blocks to that shown in FIG. 18.

As can be readily understood by viewing the schematic of FIG. 18, the architecture of the memory layout allows selection transistors 220–226 to be disposed near the highest and lowest rows of the memory block and thus forms a signal by-path through them. Therefore, the transmission path in the memory array of the contents of the selected memory cell does not travel twice the length of the diffusion layer lines or bit lines as in the previous technology. A higher speed array and a larger number of memory transistors per block is therefore achievable.

The invention also includes a methodology which utilizes the generation of dynamically modeled clock signals to manipulate bit lines in a large scale integrated memory dynamically. Turn, for example, to the block diagram of FIG. 21 and the associated timing diagram of FIG. 20. A dummy decoder generator and dummy word line is used in addition to the decoder and word lines conventionally employed in read-only memories. A control block outputs a signal based on a signal from the dummy generator. The generated signal is used as a clock signal for the memory array to run the memory cell at a high speed with low power consumption.

Figure 22:
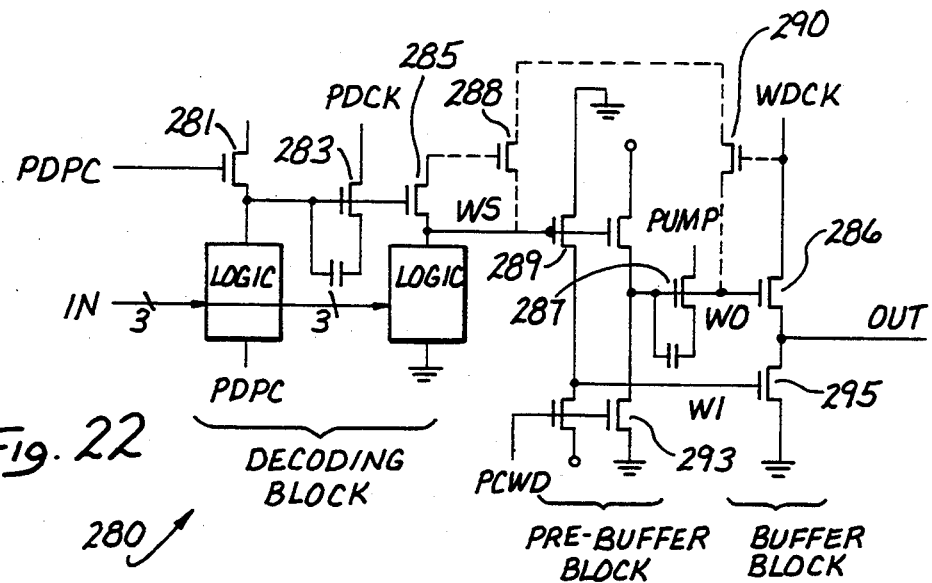
FIG. 22 is a schematic diagram of a buffer circuit incorporating the invention.

Control circuit 260 generates the signals SELV (select voltage), PC0, PC1 and PC2, described in connection with FIGS. 19 and 20 and as shown in FIG. 22. These signals are coupled and employed in memory block array 262 of FIG. 19 as therein described.

A clock signal PDPC is coupled to dummy predecoder 264 and to a conventional decoder 266. The output of dummy predecoder block 264 is a control signal PDMY (predecode dummy). PDMY is used as a clock signal for dummy word line decoder 268 and conventional Word line decoder 270.

Dummy word line decoder 268 has two dummy word lines 272'-272 and 274'-274. Two lines are necessary because it is essential to model both the previously selected word line and the newly selected word line for more accurate timing decision and process modeling. The signal provided by dummy word line decoder 268 on dummy word lines 272' and 274' are DMYA' and DMYB', respectively. These signals are fed back at the end of lines 272 and 274 to flip-flop 276. The output of flip-flop 276 is returned to dummy word line decoder 268 so that by action of the flip-flop and a control circuit 278, DMYA' 272 and DMYB' 274 are alternately chosen as the old and new word lines for the next cycle.

In the memory array the previously selected or old word line will be driven to ground or low on the beginning of the next memory cycle and the newly addressed word line will be driven high. Only one word line must be high in the entire memory circuit during a valid memory cycle. Flip flop 276 keeps track of which of the dummy word lines, DMYA-A' and DMYB-B' is going high and therefore the new line model and which is going low and therefore the old line model. Control circuit 278 uses DMYA and DMYB with the information provided from flip-flop 276 to fabricate two new signals, OLDWD and NEWWD shown in FIG. 21a. Control circuit 278 multiplexes DMYA and DMYB together to form signals indicative of the voltage on the model representing the old word line and the model representing the new word line. Multiplexing is required since DMYA and DMYB 272 and 274 exchange modeling roles after every memory cycle. This information is provided to control circuit 260 which determines from the voltage curves of the model old and new word lines when the voltages are low enough on the old word line and high enough on the new word line to begin certain timing signals for the next memory cycle.

By finding the transitional points in DMYA' and DMYB' outputs from dummy word line decoder 268, it can be determined that the conventional word line decoder is at a state where the address set up is complete. Dummy line 272'-272 and 274'-274 are coupled between the DMYA' and DMYB' outputs of dummy line decoder 268 and control circuit 278 respectively. The signal transition points of the word lines farthest from the word lines decoder are determined by constructing that part of the circuit to match the word line used in the memory array block.

Also, dummy word lines 272 and 274 are checked for signal up and down transitions. These dummy word lines are controlled by dummy word line decoder 268 so that if one of the two lines is high, the other goes low. To achieve this, DMYA and DMYB signals are input into flip-flop 276 and returned to dummy word line decoder 268.

A core transistor memory cell as used in the memory array is included within control circuit 278 for modeling the functions of the memory cells used in the memory array block 262. DMYA and DMYB are coupled into control circuit 278 to change the model core FET gate voltage. By determining the voltage transition point in the output signal from the model core FET memory cell, it can then be concluded that the bit line in the memory array blocks are at the same state and the address set-up is complete. The coupling of an old word line, OLDWD, and new word line, NEWWD, signal from control circuit 278 to control circuit 260 allows the timed precharge signals SELV, PC0, PC1 and PC2, to be properly generated by control circuit 260 for use in the actual memory array block 262 as described in connection with the memory array of FIGS. 19 and 20.

Therefore, by constructing the dummy blocks and conventional decoder word lines with the same circuit patterns as used in the conventional decoder word lines, and by using output signals generated from the dummy circuits, final clock signals are generated.

By checking the status of block selection and word line set-up, it is possible to specify the memory array precharge and discharge periods through PC1 and PC2, since it is known when the conventional decoder and word line set-up is completed. This in turn makes it possible to customize the clock signals, depending on the characteristics for each LSI chip, to allow use of the fastest reliable response time.

The SELV signal is also generated to prevent erratic behavior of conventional NOR-type memory cells by preventing a new memory cycle from starting until the word line which was selected in the previous cycle is completely discharged.

In addition, the selected bit line can be appropriately charged or discharged by the signal PCO. By inputting the signals into the memory array, the current consumption or power consumption in the array is decreased.

Turn now to the circuit schematic of the word line or address decoder and driver of FIG. 22 whose operation is described in connection with the timing diagram of FIG. 23. The circuit of FIG. 22 is comprised of a decoding block, generally denoted by reference numeral 280, a prebuffer block, generally denoted by reference numeral 282 and a buffer block, generally denoted by reference numeral 284. A signal, WS, is output from decoding block 242 from inputs, IN, is applied to decoding block 280. IN is typically a three bit address which is decoded by decoding block 280. Conventional decoding logic, such as an 3-to-8 decoder is used for the drive circuits of a first inverter stage 281 and second inverter stage 283.

WS is input into prebuffer block 282 and converted by prebuffer block 282 into output signals, WO and W1, which are then input into buffer block 284. The output signal, OUT, is then generated by buffer block 284 to drive the word line. If the WO signal, for example, is affected by coupling noises, being felt on the gate of transistor 286, it is possible that transistor 286 will go into half-on state, become unstable and emit a large number of hot electrons. The possible timing of the WO signal as might occur, if transistors 288 and 290 were not present, is shown in FIG. 23, indicated by timing line 292 in FIG. 23.

The precharge state, P, is followed by precharge-hold, P/H. The coupling of the voltage supply to the WO signal does not take place during the P/H period until the signals WDCK and PUMP rise. The voltage of the WO signal is maintained during this time only by the line and gate capacitance of transistor 286.

Figure 23:
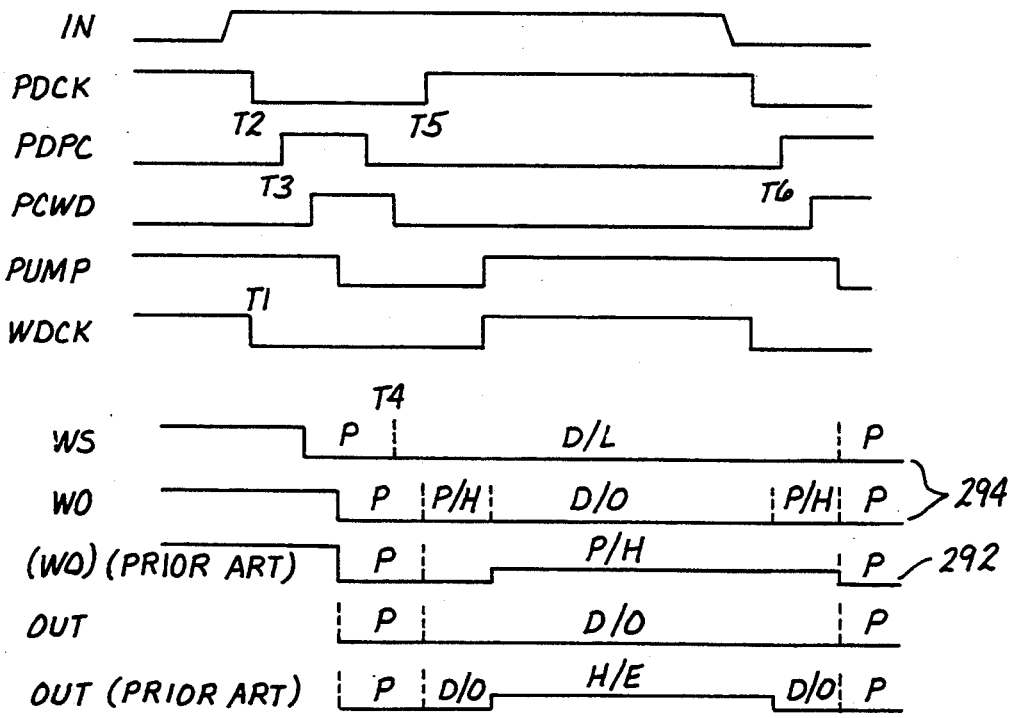
FIG. 23 is a timing diagram of the signals depicted in FIG. 22.

Refer now to both FIGS. 22 and 23 to understand the operation of the word line driver of FIG. 22. A precharge cycle is initially entered when predecode clock, PDCK and word clock, WDCK go low at T1. Predecode precharge, PDPC, goes high at T2 followed by precharge word, PCWD, at T3. WS is precharged at T2 through transistor 285. Precharge word, PCWD, goes high at T3 turning on transistors 291 and 293 driving W1 high and WO low, and turning transistor 295 on and turning transistor 286 off. OUT will be set at a precharge low state. PUMP goes low at T4 followed by PDPC and PCWD. WS and W0 will remain in a precharge-hold period, P/H, until T5 when PDCK returns high followed by WDCK. The voltage at WS is now coupled through transistors 288 and 287, which are turned on, to W0. PDCK and WDCK remain high until T6 just following the end of the valid input period of IN. If the circuit was selected by the logic circuits on the first and second inverter stages, OUT goes high during the D/O period.

According to the invention, a new period, data-out period, D/O, is provided as shown in the timing diagram of FIG. 23 by utilizing transistors 288 and 290 in FIG. 22. D/O is the period wherein the WS voltage level is supplied to the WO signal through transistors 288 and 290. The effect of coupling noise on the input gate 286 is drastically thus reduced. The voltage level WO is stabilized and the number of hot electrons emitted from transistor 286 is reduced to a safe level. The period during which the data is held by line and gate capacity is thus illustrated in FIG. 23 by the shorter data-hold period D/H on line 294. In particular, in the unselected state in which hot electrons are most likely occur, the low or deselected state precharged on node WO is reinforced through transistors 288 and 290 by the driven low node WS.

The WO signal level is stable due to the action of transistors 288 and 290. As a result, stable behavior of the buffer output signal is obtained and hot electrons emitted at transistor 286 are reduced.

Figure 10:
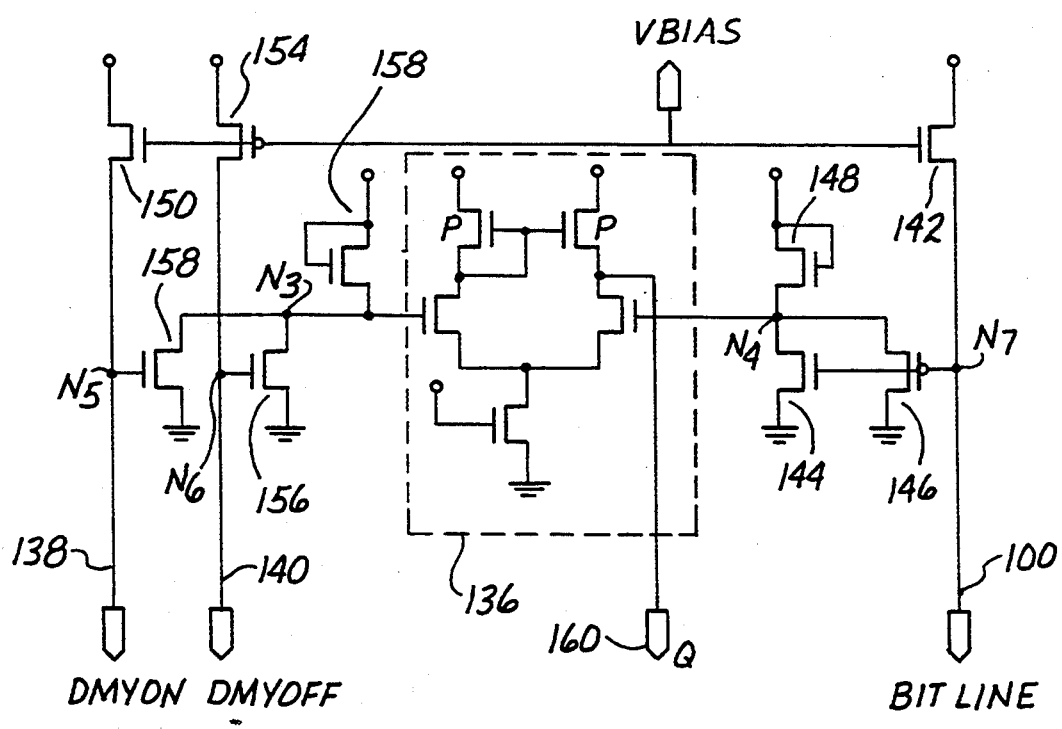
FIG. 10 is a circuit diagram of a sense amplifier incorporating the invention.

Turn now to FIG. 10 which illustrates sense amplifier 40 of FIG. 1. A differential amplifier, collectively denoted within the dotted outline of reference numeral 136 amplifies the difference between two inputs at nodes N3 and N4. The difference is the output 160, Q. A main bit line 100, for example, from memory cell array 36 of FIG. 1 is coupled with N memory cells which are turned on or off due to an application of a gate voltage used to address the memory cells. N is the number of memory cells coupled to a typical bit line within the memory array. A dummy bit line 138 corresponding to the on state and a dummy bit line 140 corresponding to the off state are shown in the left portion of the schematic of FIG. 10.

A programmed ON memory cell driven by the selected word line is placed in a position farthest from the word line generator, where the word line voltage will be at a minimum, along with a maximum number possible of OFF programmed memory cells in the selected memory bank gated by all the other deselected word lines and are connected to the dummy bit line 138 in a fashion as similar to the actual bit line. The object is to create a model of the worst ON, least leaky bit line possible. Likewise a programmed OFF memory cell driven by the selected word line is placed in a position nearest the word line generator, where the word line voltage will be at a maximum along with the maximum number of possible ON programmed memory cells in the selected memory bank gated by all the other deselected word lines which are connected to the dummy word line 140 in a fashion similar to the actual bit line. The object is to create a model of the most leaky OFF bit line possible.

Main bit line 100 which is pulled up through NMOS transistor 142 is connected with the gates of two NMOS transistors 144 and 146. Transistors 144 and 146 are coupled in parallel between node N4 and ground. Node N4 is pulled up through NMOS transistor 148. Dummy bit line 138 is pulled up through NMOS transistor 150. Dummy bit line 138 is also connected to the gate of NMOS transistor 152. NMOS transistor 152 is connected between node N3 and ground. Dummy bit line 140 is pulled up through NMOS transistor 154. Dummy bit line 140 is also coupled to the gate of NMOS transistor 156 which in turn is coupled between node N3 and ground. The voltage node N3 is pulled up through pull-up transistor 158. Thus the voltage node N3 is determined according to the operation of transistors 152, 156 and 158 while the voltage on node N4 is similarly determined by the operation of transistors 144, 146 and 148. A bias voltage, VBIAS, is applied to the gates of pull-up transistors 150, 154 and 142.

The operation of the sense amplifier of FIG. 10 is as follows. Assume that the voltage on dummy bit line 138, dummy bit line 140 and bit line 100 is in excess of the threshold values of transistors 152, 156 with respect to dummy bit lines 138 and 140 and in excess of the threshold of transistors 144 and 146 with respect to main bit line 100. Voltage at nodes N3 and N4 will be equal, higher or lower with respect to each other as follows. If the average voltage on the gates of transistors 158 and 156 is equal to the voltage applied to transistors 144 and 146 from main bit line 100, then the voltage on nodes N3 and N4 will be equal. If the average voltage on the gates of transistors 158 and 156 is greater than the voltage applied to the gates of transistors 144 and 146 from main bit line 100, then the voltage at node N4 will be greater than the voltage at node N3. If the average of the voltage at the gates of transistors 158 and 156 is less than the voltage applied to the gates of transistors 144 and 146 from main bit line 100, then the converse is true, namely, the voltage at N3 will be greater than the voltage at N4. This relationship is achieved by appropriate relative sizing the transistors in question.

Assume now that the voltage on main bit line 100 is between an on-state voltage and off-state voltage of the selected memory cell. Assume further that the voltage of dummy bit line 140 is at the voltage off-state level while voltage on dummy bit line 138 is at on-state level. Finally, assume that the magnitude of the voltage off-state is greater than the voltage on-state. When the selected memory cell is on, the average voltage applied to the gates of transistors 152 and 156 necessarily equals the average of the voltage on and off states. Since we have assumed that the selected memory cell connected to bit line 100 is on, the voltage applied by bit line 100 to the gates of transistors 144 and 146 is less than the voltage applied at node N3. Therefore, according to the biasing of nodes N3 and N4 described above, the voltage at node N3 is less than the voltage at node N4.

Similarly, if the selected memory cell were off, then the off voltage level applied to the gates of transistors 144 and 146 would exceed the average voltage applied to the gates of transistors 152 and 156. Again from the description of the biasing of nodes N3 and N4 above, this results in the voltage of N3 being greater than the voltage at N4.

Therefore, while a constant voltage is applied to node N3, a higher or lower voltage than node N3 is applied to node N4 in response to the selected memory cells depending on whether the cell is in the off or on state. The voltage difference between nodes N3 and N4 is amplified by differential amplifier 80 whose output is provided as at sense voltage terminal 160.

Leakage current which is generated over the entire memory cell array is uniformly applied to main bit line 100 and dummy bit lines 138 and 140. Assuming then that the drop of voltage due to the leakage current occurs equally on dummy bit lines 138 and 140, the average voltage applied by lines 138 and 140 to the gates of transistors 152 and 156 also occurs at bit line 100. This effectively eliminates leakage current on the sense amplifier read-out regardless of the voltage or current on the word lines within the memory cell array, since dummy bit line 138 and 140 are positioned within the array where the word line generation voltage is at a maximum and minimum respectively.

Figure 11:
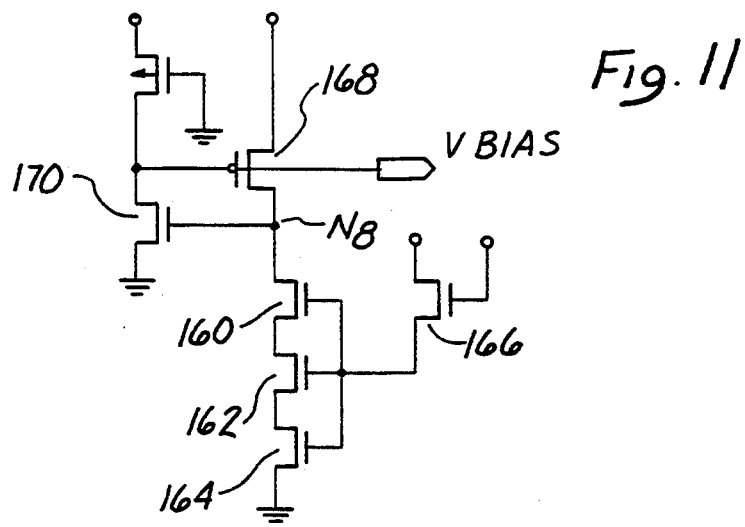
FIG. 11 is a circuit diagram for a bias circuit to generate a bias voltage utilized in the sense circuit of FIG. 10.

Turn now to the operation of a bias voltage generator depicted in the schematic FIG. 11 which generates the voltage VBIAS utilized in the sense amplifier of FIG. 10, which bias is applied to the gates of pull-up transistors 150, 154 and 142. NMOS transistors 160, 162 and 164 are coupled in series between a node N8 and ground and are sized and constituted similar to the memory cell series array seen in a bit line. A constant voltage is applied to the gates of transistors 160–164 from pull-up transistor 166. Transistors 160–164 are in series with load transistor 168 whose gate is coupled to the output of inverter 170. The input of inverter 170 is also coupled to node N8 while the output of inverter 170 is the voltage, VBIAS.

When memory current is reduced by variations in process parameters or other factors, the voltage at node N8 is increased because this variation is reflected in higher resistance of transistors 160–164, and the bias voltage is reduced, thereby stabilizing the operation of the sense amplifier of FIG. 10. Similarly, if the memory cell current is increased, the bias voltage is increased. Potentials at the gates of transistors 152, 156, 144 and 156 of FIG. 10 are therefore maintained at constant levels with respect to variations in memory cell current by applying appropriate bias to pull-up transistors 150, 154 and 142.

If the bias voltage is not controlled, no voltage difference is caused between nodes N3 and N4 when the potential on dummy bit line 138 is excessively increased by reduction of the on-state current. Therefore, a sufficient differential input cannot be applied to differential amplifier 136 with the result that speed is lowered and the noise margin is reduced. The operation of the bias circuit of FIG. 11 provides necessary bias control offset increases in the memory cell on-state current by adjusting bias voltage in response to a current model of the bit lines, namely the similar construction and sizing of transistors 160, 162 and 164 to the memory cell sets.

Figure 13:
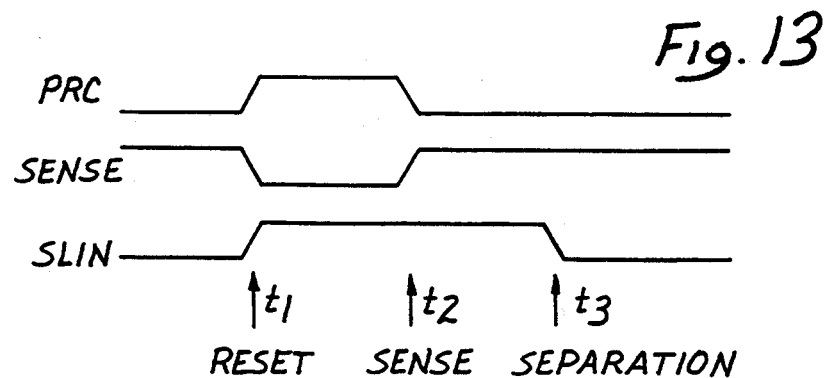
FIG. 13 is a timing diagram of the sense circuit illustrated in FIG. 12.

A trigger circuit is used to generate precise timing for the latch-type sense amplifier triggering with the use of the signals DMYON and DMYOFF. Time allowance is incorporated to compensate for leakage and delay of the sense amplifier decision point, namely, time T3 on the latch signal, as shown in FIG. 13. The decision point is that time wherein sufficient voltage margin has been attained to allow a reliable sense decision to be made.

Figure 24:
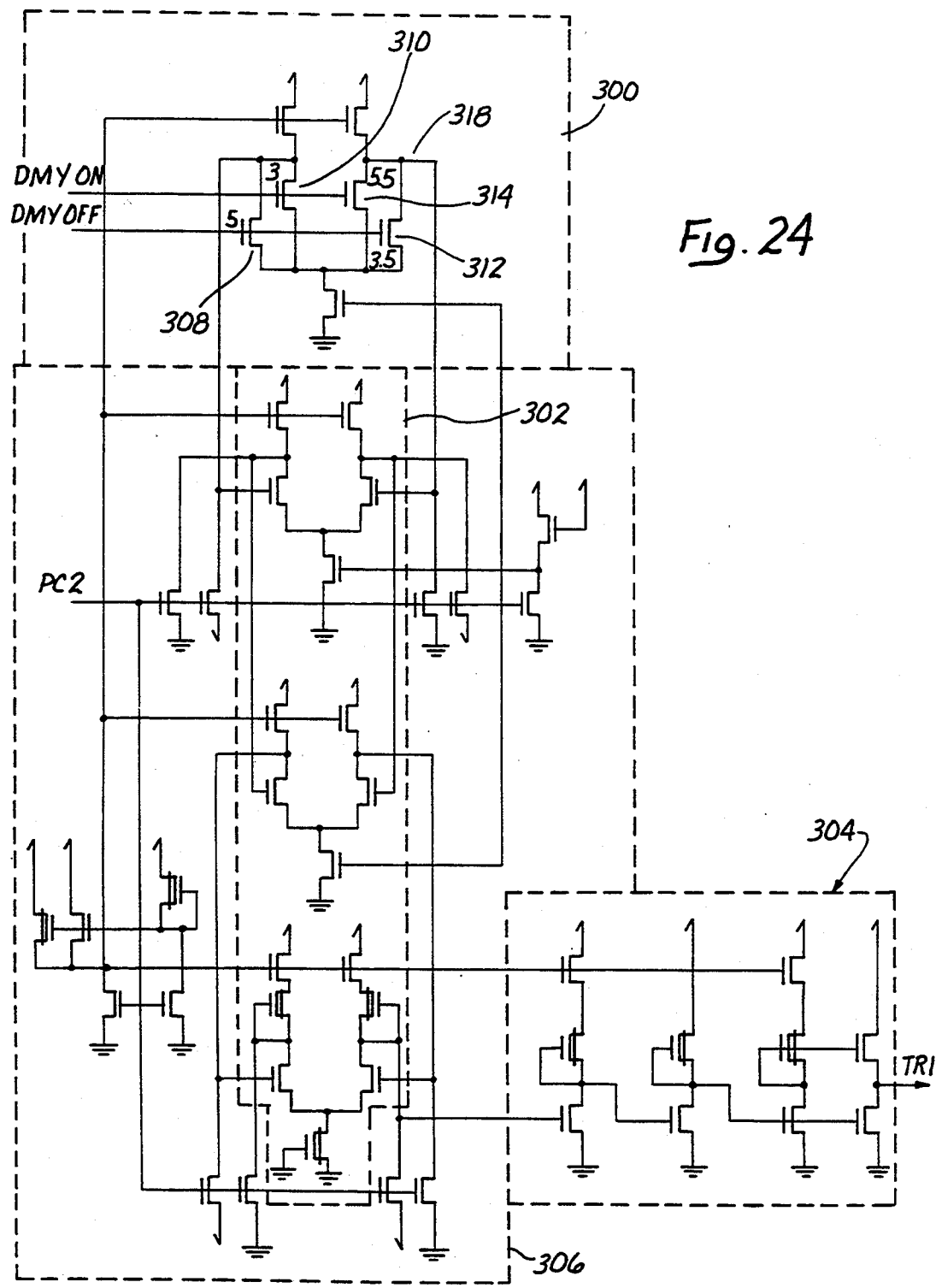
FIG. 24 is a schematic diagram of a sense amplifier trigger circuit incorporating the invention.

Turn now to FIG. 24 which shows an NMOS version of a trigger circuit of the invention. The trigger circuit is used to generate a signal to latch the sense amplifiers at the earliest time consistent with reliable performance. The trigger circuit can be understood as being comprised of four sections. A first section 300 is an sensing stage which detects the difference between DMYON and DMYOFF as utilized and described in connection with the sense amplifier of FIG. 12.

A second section generally denoted by reference numeral 302 is comprised of three differential amplifier stages used to amplify the sense signal from sensing stage 300. The amplified signal is then coupled from differential amplifier 302 to a level detect stage, generally denoted by reference numeral 304.

Level detect stage 304 converts the output from the last differential amplifier of differential amplifier stage 302 to a full level signal with predetermined rise and fall times with no indeterminate signals in relation to the timing and voltage levels required by the sense amplifier to which TRIG will be supplied. Stage 304 is set to switch at an operating point on the transition of the signal from differential amplifier 302 that is steepest and thereby minimizes indeterminacy that might arise from switching on a more slowly changing portion of the differential amplifier's output.

An inhibit stage, generally denoted by reference numeral 306, is used to prevent false triggering during a nonsensing time period when the precharge signal PC2 is active.

Sensing stage 300 is designed to match the characteristics of the sense amplifier, such as described in connection with FIGS. 10 and 12, as closely as practical and uses the DMYON and DMYOFF signals to determine whether there is enough current in the bit line to latch the data and to turn on the output drivers. This circuit compensates for process variations in the device parameters and for variations in the sizes of the ROM cell arrays.

Consider now in more detail the operation of sensing stage 300. Sensing stage 300 utilizes FET's 308–314 which are constructed so that they are similar in size to the those of the sense amplifier, namely, two transistors 170, 172 and 174 of FIG. 12. In the layout, the corresponding transistors 308–312 in FIG. 24 have the same length as transistors 170, 172, and 174 in FIG. 12. In the illustrated embodiment the width of these transistors are defined by the following seven conditions:

1. $W170 = W172 = W174$
2. $W170 + W172 = 2\ W174$
3. $W308 + W310 = W170 + W172$
4. $W314 = W308 + dW$
5. $W312 = W310 + dW$
6. $W308 + W310 = (W312 - dW) + (W314 - dW)$
7. $W308 = (1 + K)W310$

Figure 12:
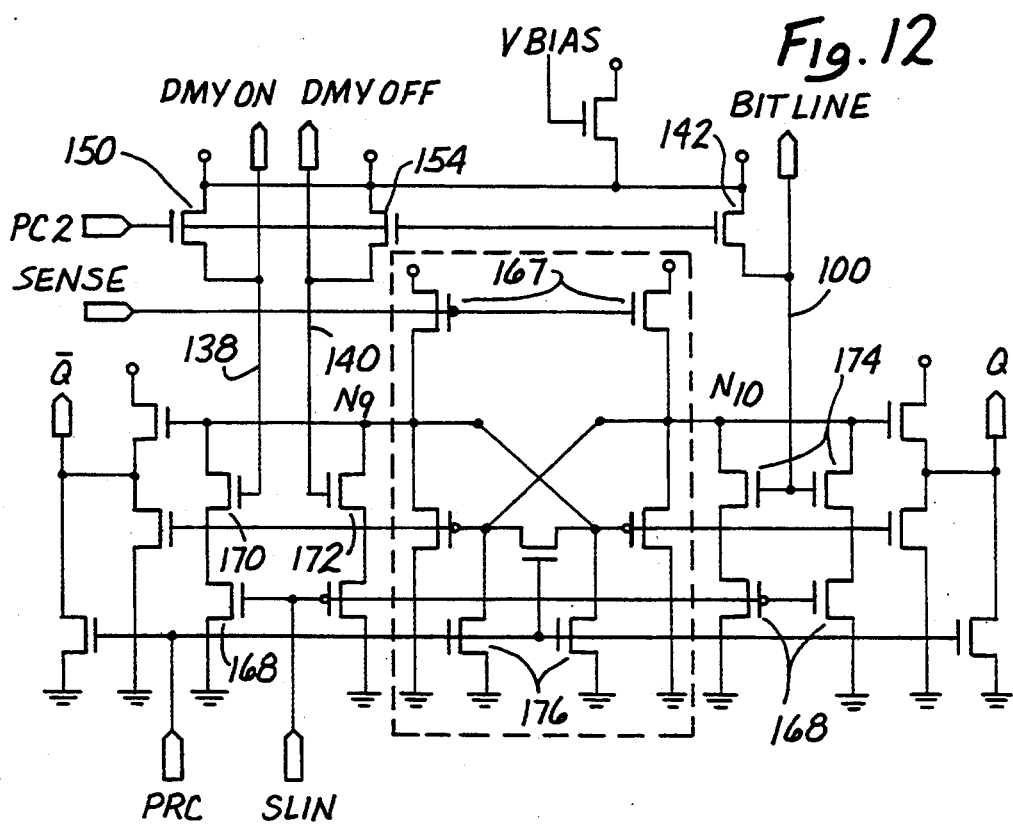
FIG. 12 is a schematic diagram of another embodiment of the sense circuit incorporating the invention.

Wi refers to the widths or sizes of transistors having the ith reference numeral in FIG. 24 and in the sense amplifier of FIG. 12. These specific relationships are chosen in order to insure that the voltages on nodes N9 and N10 of FIG. 12 comply with the description given in connection with the description of the circuit of FIG. 12.

Relationship 3 above sets the sense amplifier trigger circuit to a current position which will be as similar to the sense amplifier as possible.

Condition 6 sets the initial state of the trigger circuit 300 to a nontriggered state in the precharge period and determines the minimum size of dW. However, dW is made as small as practical to emulate the conditions of the sense amplifier.

Relationships 4, 5 and 7 set the amount of current differential necessary in the model bit lines DMYON and DMYOFF to insure that a reliable decision (with K greater than 1) is always made.

Both the sense amplifier of FIG. 12 and trigger circuit 24 are sensitive to the relative currents in their opposing sides. The sense amplifier will go to a logic low on that side that is drawing the greater current when the trigger point, T3 of FIG. 3, is reached. The trigger circuit of FIG. 24, on the other hand, is a static nonlatching differential amplifier. The memory circuit begins with all bit lines and DMYON and DMYOFF precharged and shorted together. Therefore, these voltages begin at the same level. As transistors 312 and 314 are narrower than transistors 308 and 310, the current which will be flowing through ground through transistors 312 and 314 will be greater by an amount equal to the ratio of their widths, namely,:

$$(I308 + I310)/(I312 + I314) = (W308 + W310)/(W312 + W314) = (W308 + W310)/(W308 + W310 + 2dW)$$

The trigger circuit will therefore start off with node 316 high and node 318 low due to the small 2 dW difference. As the memory cycle progresses, DMYON drops in voltage faster than DMYOFF so that the current in transistors 310 and 314 drops faster than the current in transistors 308 and 312. The ratio of the widths of transistors 308 and 310 and of transistors 312 and 314 sets the amount of current drive difference in a sense amplifier that will be necessary to allow a reliable decision to be made.

For example, the width of transistors 308 and 312 driven by DMYOFF is 5 and 3.5 units respectively. The width of transistors 310 and 314 is driven by DMYON 3 and 5.5 units respectively. The cumulative current path for node 318 is therefore 9 units and the path for node 316 is 8 units. Hence, node 316 starts off higher than node 318. Since DMYON drops in voltage while in the illustrated embodiment, DMYOFF is relatively constant, transistor 314 starts to turn off faster than transistor 310 since their width ratio is 5.5:3. This provides for a differential switching of trigger circuit 300 determined by transistor widths in the trigger circuit based on current flows from the dummy bit lines and hence emulative of the bit line current in the sense amplifier. The sense amplifier will not be allowed to sense the bit lines until triggered by the circuit of FIG. 24. The circuit of FIG. 24 will not trigger until there is a predetermined amount of current differential in the bit lines connected to memory cells which are on, if selected, verses the current in the bit lines connected to memory cells which are off, if selected.

Figure 19:
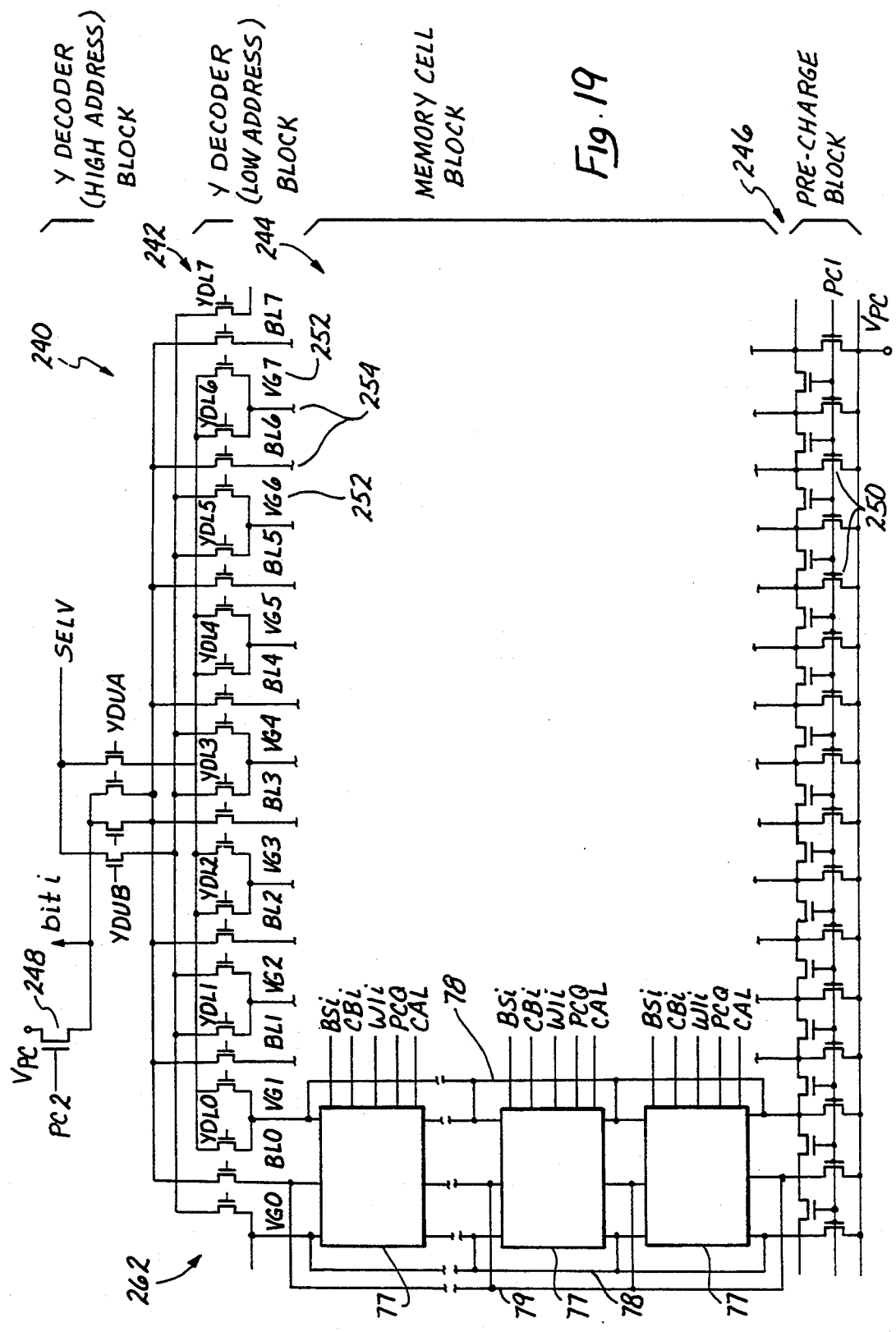
FIG. 19 is a schematic diagram of a precharging scheme of a memory array incorporating the invention.

FIG. 19 shows a precharged circuit incorporating the invention. FIG. 20 is a timing diagram corresponding to FIG. 19. The overlying metalization lines and 79' connect multiple blocks of memory cells in the schematic of FIG. 19. Only one block of memory cells has been depicted for the sake of simplicity and clarity of illustration. It must be understood that the memory blocks are replicated, reversed, and connected end-to-end to create a memory having several megabytes of capacity. The architecture of the memory array of FIG. 19 is comprised of four major blocks: (1) a Y decoder block for the high address portion generally denoted by reference numeral 240; (2) a Y decoder block for the low address portion, generally denoted by reference numeral 242; (3) a memory cell block, generally denoted by reference numeral 244; and (4) a precharge block, generally denoted by reference numeral 246.

As seen in the top portion of the schematic in FIG. 19, the memory array is provided with a precharged voltage VPC. Charging and discharging of the bit lines are controlled by control signals SELV, PCO, PC1 and PC2 as labeled in FIG. 19.

PC2 is coupled to the gate of precharge select transistor 248 and serves to precharge the bit line from the memory array. PC2 is the bit precharge which charges only selected bit lines connected to the sense amplifier 40 to a certain precharge level.

PC1 is selected in common to the gates of a plurality of precharge transistors 250 which are coupled in series with each virtual ground line 252 and bit line 254 within the memory cell block 244. PC1 is a blanket precharge. PC1 charges all the bit lines and source side select lines to a predetermined precharge level.

PCO is coupled in common to the gates of precharge transistors 256 within the memory array, which transistors 256 are coupled between adjacent bit lines in an array similar to that shown in FIG. 18. Precharge transistors 256 short each of the bit lines together to allow a precharge to be coupled through transistors 250 to all the bit lines within the memory block. PCO is a bank precharge signal. PCO charges all the bit lines in a selected bank which are precharged and shorted together so that previous charge from any previously selected memory cell access within the block is eliminated. The bit lines are precharged equally with the predetermined precharge level.

The control signal SELV is a select virtual ground command. SELV pulls the source side of a selected memory cell bit to ground level.

A sense latch input signal, SLIN, conventionally generated by timing circuit 39 of FIG. 1, causes the sense amplifier to be set in its active sense state rather than in a precharge state or final latch state.

Because of the architecture shown in FIG. 19 and due to the dynamic timing of PCO and PC1, the charging and discharging of the bit lines occurs in a very short time. To guarantee the signal levels, the bit line connected to the sense amplifier held at a precharged level by pulling the PC2 signal to a logic high and placing SLIN to a logic low.

The use of PCO as disclosed fully precharges the selected bit lines as well as nonselected banks. As a result, any effect of a preceding memory cycle is quickly eliminated and the circuit is prepared for a new memory cycle. Any bit fine delay is also minimized.

In order to obtain a high speed response, PC1 is used to simulate a condition similar to that where all bit lines are statically precharged.

By using SELV as disclosed, only selected bit fines are pulled down to the ground level, leaving most of the memory array at its precharged state. This prevents erratic behavior which is often found in conventional NOR-type memory cell arrays.

PC2 keeps the bit line connected to the sense amplifier at a certain precharge level even when the bit line is not selected. This improves the speed of the sense amplifier when the bit fine is in fact selected, since it reduces the time of precharge of the sense amplifier and protects it from switching noise which might arise from address switching early in the cycle.

Figure 20:
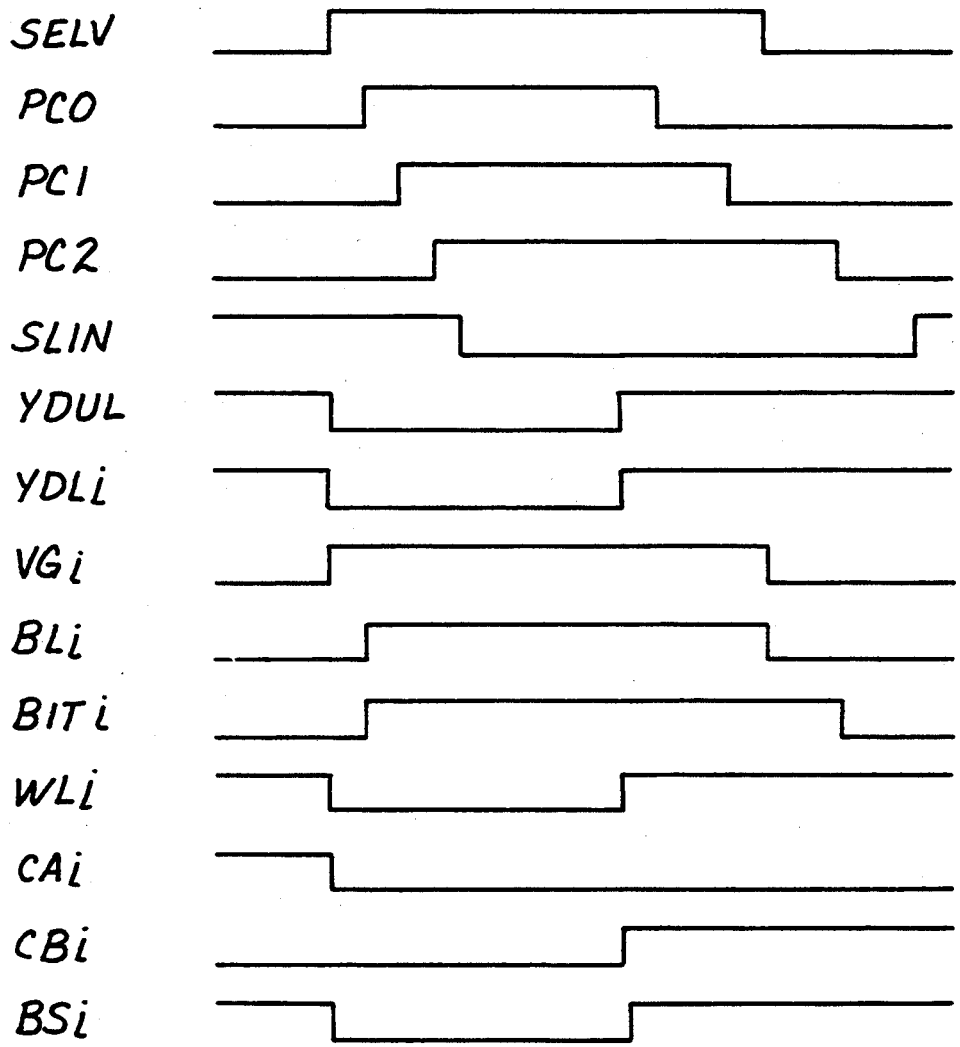
FIG. 20 is a timing diagram of the circuit of FIG. 19.
Figure 21:
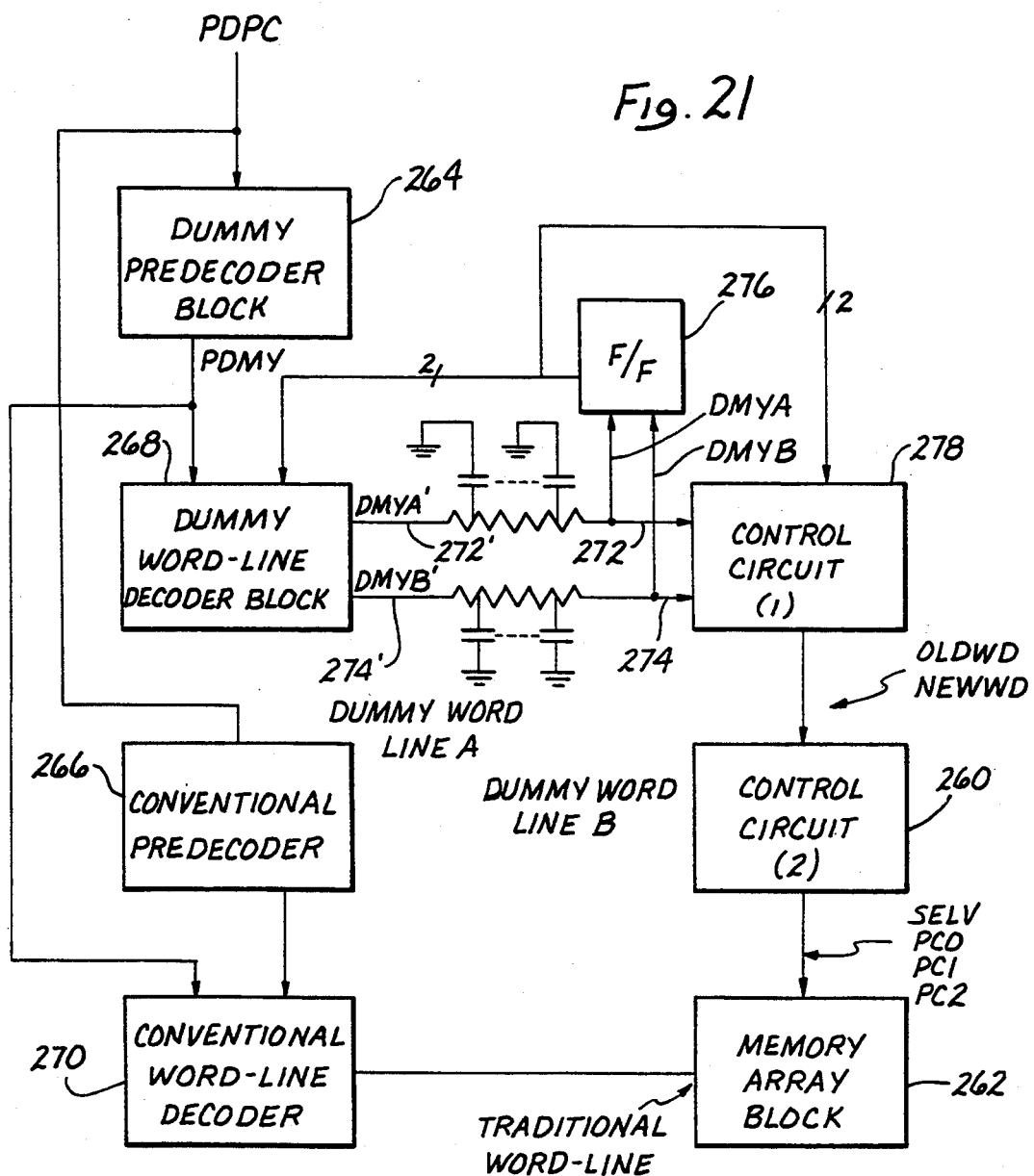
FIG. 21 is a block diagram of a memory array architecture incorporating the invention.

The operation of the circuitry of FIG. 19 is better understood in connection with the timing diagram of FIG. 20. The five precharge signals, SELV, PC0, PC1, PC2 and SLIN, are shown as the first five curves in FIG. 20. Conventional upper address Y gate signals for blocks A and B of the array, YDUA and B, and lower address Y gate signal, YDLO-7, are the next two curves depicted. The ith virtual ground line, VGI, the ith bit line, BLI, the ith word line WLI, the block selection signals, CAI and CBI, and the bank selection signal, BSI, are also depicted in that order.

The precharge signals, SELV, PCO-2 and SLIN, are dynamically set before and after a bit is selected so that the delay on the bit line is reduced and the increased current consumption due to conventional dynamic bit line action is prevented. The time line on the diagram of FIG. 20 goes from a period T1, where the memory cell is selected, to a period T2 where it is not selected and back to a memory selection, T1, as indicated on the top time fine. SELV and PC0-PC2 go active high during time T2 and are then turned active low at various points within period T1. SLIN similarly goes active low during T2 and active high during T1. The remaining signals all refer to various aspects of the memory cell access as described above and as illustrated in FIG. 20 are active or inactive as appropriate, depending upon whether the memory cell is not being selected during period T2 or selected during period T1.

FIG. 20 illustrates the setting of the precharge signals before and after the bit is selected so the circuit remains in a precharged condition ready for operation. The first four precharge signals are thus pulled to a high logic level and all bit lines are set at a precharge level when the memory cell is not selected. SLIN signal is pulled low, allowing the sense amplifier to remain in a low current latched state.

When the memory cell is selected, PCO is first set to a low logic level as the selected word line WLI and column select signals CAI and CBI, bank select BSI, and Y select lines, YDLi, YDUi, are driven to their corresponding predetermined states. PC1 is then set to a low logic level. Therefore, the source side of a selected bit line is pulled to ground, as SELV is set to a low logic level. This effectively causes the selected bit line to be read and set at a standby voltage condition. Precharged signal PC2 corresponding to the bit lines is coupled to the drain side of a sense amplifier and is pulled to logic low, allowing the sense amplifier inputs to go to their corresponding selected states. Finally, SLIN goes high causing the sense amplifier to go to its high power or current consumption sensing state from its preliminary precharged state. At this point sense amplifier senses the selected bit line.

When the memory switches from the memory cell selected state T1 to the memory cell not selected state T2, the conventional selection signals change first. SELV is simultaneously pulled to a high logic level, causing the selected source side bit line, which is set to the ground level, to return to a precharged level. PCO is then changed to a high logic level and all the bit lines selected in the bank are returned to precharged levels. PC1 is then returned to a high logic level and all bit lines and source side select lines are precharged. Finally, SLIN goes low, allowing the sense amplifier to return to its low or zero current lapsed state. Consumption current is then held to a minimum during time period T2.

A second embodiment of sense amplifier 40 of FIG. 1 is schematically depicted in FIG. 12. The operation of the sense amplifier of FIG. 12 is based upon a dynamic latch circuit shown within the dotted outline denoted by reference numeral 172. A similar dummy bit line 138 corresponding to the on-state and dummy bit line 140 corresponding to the off-state is provided as was the case with the embodiment of FIG. 10. Precharge transistors 150, 154 and 142 are also provided to bit lines 138 and 140 and 100, respectively. Voltage VBIAS is provided to the gate of transistor 999.

The inputs to latch 172, N9 and N10, are selectively enabled or disenabled by a control signal SLIN coupled to the gates of transistors 168. Voltage on dummy bit lines 138 and 140 are averaged at node N9 through transistors 170 and 172, respectively. The same leakage current compensation as described in connection with the sense amplifier of FIG. 10 is also provided by the use of the dummy bit lines 138 and 140 relative to bit line 100. The voltage from bit line 100 is analogously applied to N10 by transistors 174. Latch 172 is reset to ground by precharge signal PRC applied to the gates of transistors 176. The Q and Q- output lines 169 are also selectively grounded by PRC.

A control and timing signal, SENSE, which is the complement of PRC and conventionally generated by timing circuit 39 of FIG. 1, is coupled to the gates of transistors 167. Latch 172 will latch to the state which is highest. For example, if N10 is higher than N9, N10 latches high and N9 latches low. The output of latch 172 is coupled through buffers 171 to the corresponding Q and Q- lines.

The operation of the latch of FIG. 12 is depicted in the timing diagram of FIG. 13. Latch 172 is reset at time T1 when PRC goes active and SENSE goes logically low. Data input to the latch is enabled between times T2 and T3. The latch is disconnected from the memory cells at time T3, thereby rendering the sense amplifier of FIG. 12 insensitive to any noise which occurs outside of the T1 to T3 interval and further isolating it from the memory array outside the T1-to-T3 interval.

Figure 14:
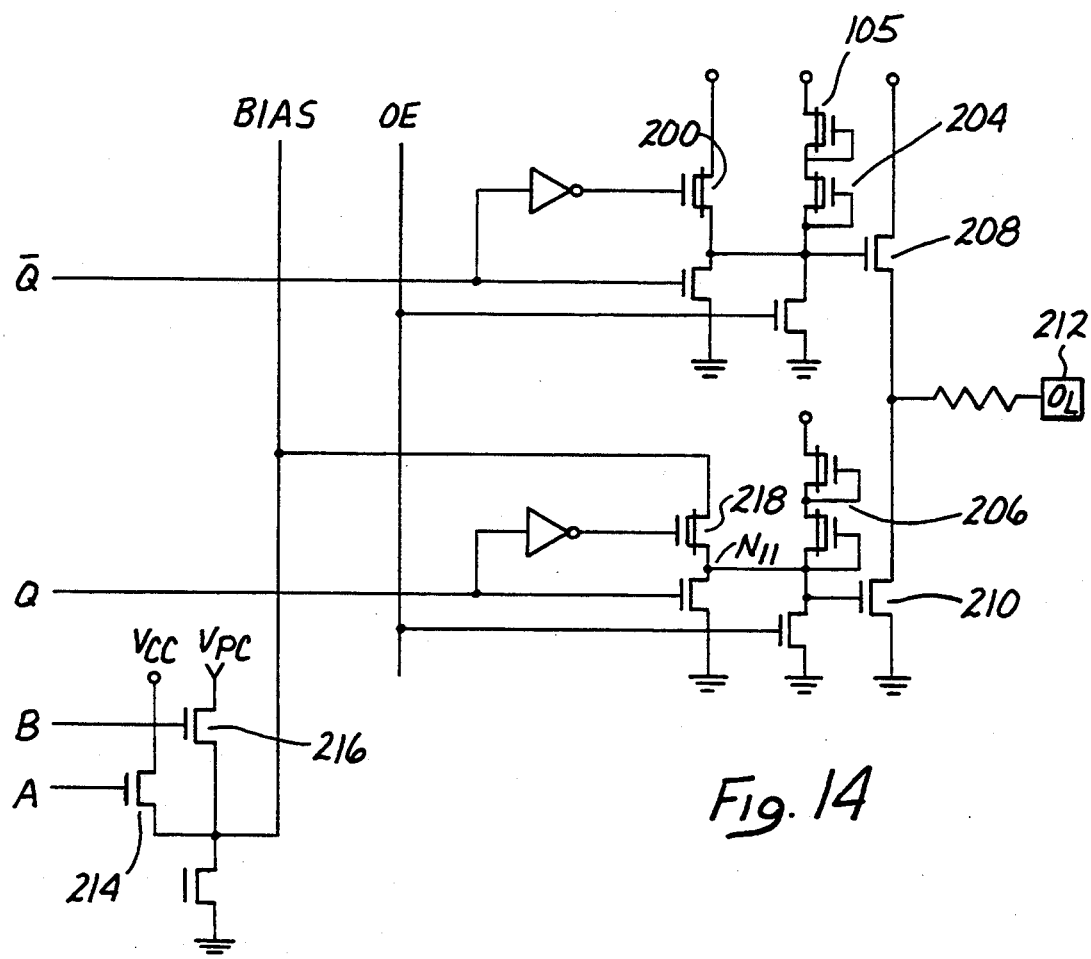
FIG. 14 is a schematic diagram showing an output buffer circuit incorporating the invention.
Figure 15:
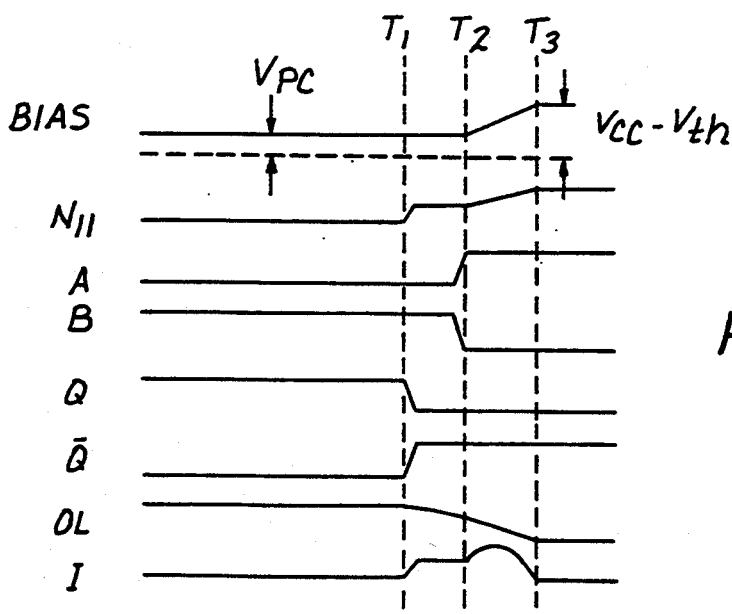
FIG. 15 is a timing diagram of the circuit of FIG. 14.
Figure 16:
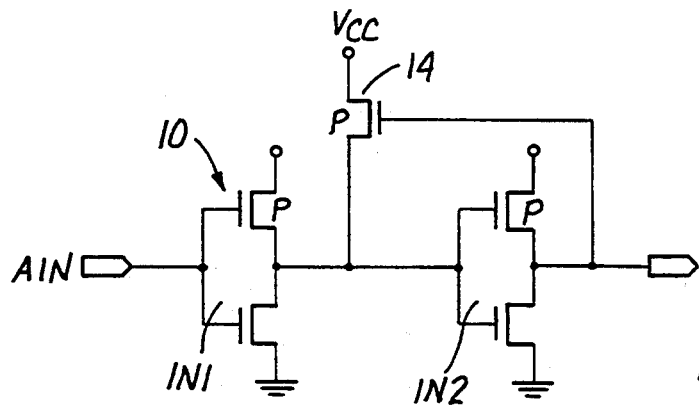
FIG. 16 is a circuit diagram of a prior art input buffer circuit.

The sense amplifier of the invention now having been described, consider improvements made in output buffer 41 of FIG. 1 as depicted in FIGS. 14 and 15. The Q and Q- signals from the sense amplifier of FIG. 12 is applied to the inputs of inverters 200 and 202. Inverters 200 and 202 are comprised of a natural load resistor and an NMOS gating resistor. Inverter 200 is coupled between VCC and ground while inverter 202 is coupled between a bias voltage, BIAS, and ground. The gates of the load transistors of inverters 200 and 202 are driven by inverters 203 coupled to the Q- and Q inputs respectively. The outputs of inverters 200 and 202 are coupled to second-stage inverters 204 and 206. The gates of the gating transistor of inverters 204 and 206 are coupled to an output enable signal OE. The outputs of inverters 204 and 206 in turn are coupled to the gates of NMOS transistors 208 and 210 of an output buffer stage coupled between the power supply and ground. The output 212 is resistively coupled to the junction between transistors 208 and 210.

As shown in FIG. 14, the bias voltage, BIAS, is applied to node N11 through a natural transistor forming the load transistor of inverter 202. The line for the bias voltage, BIAS, is coupled to the supply voltage through a transistor 214 as well as through transistor 216 to a constant voltage VPC which is less than the supply voltage VCC. The gates of transistors 214 and 216 are controlled respectively by control signals A and B, which are conventionally generated timing signals from timing circuit 39 of FIG. 1. Natural transistors 217 and 218 of inverters 200 and 202 respectively have a threshold voltage of substantially zero volts.

When the signal Q is converted to a low logic level from a high logic level, signals A and B according to the control scheme of the invention are changed after a time delay as best depicted in FIG. 15. The signal Q changes at time T1 while signals A and B change at time T2. The bias voltage is maintained at VPC until the signals A and B are changed. Thus the voltage at node N11 is not immediately converted to Vcc simultaneously with the transition of Q. The result is that NMOS transistor 210 of the final stage inverter is not completely turned on in the output circuit. The amount of current flowing from output pin 212 into ground is therefore small.

When the signals A and B change, the bias voltage is converted to the same level as Vcc as shown in FIG. 15 at time T3 and the node N11 is driven to a high logic level. NMOS transistor 210 of the final stage inverter 206 is then completely turned on and the current again flows from output 100 to ground.

Therefore, current flowing from output pin 212 into ground is divided into two stages by the output buffer circuit of FIG. 14. The current peak is therefore controlled to suppress instability of potential at ground, that is, the occurrence of noise signals on the ground line.

The invention is also embodied in a VLSI circuit device used to detect relative differences in circuit speed as may be caused by voltage, temperature or processing tolerances in order to provide a means of compensating for these variations when they adversely effect the circuit performance, particularly the output buffer power supply pin inductance. As will be described in greater detail in connection with FIGS. 26, a circuit is shown and described which switches the supply voltage to a bias voltage based on the signal output from a latched logical circuit. The signal from the latched logical circuit is changed, depending on which one of two signals which were input simultaneously to an RC-type delay circuit and to a gate delay circuit arrives first at a latched logical circuit.

Figure 25:
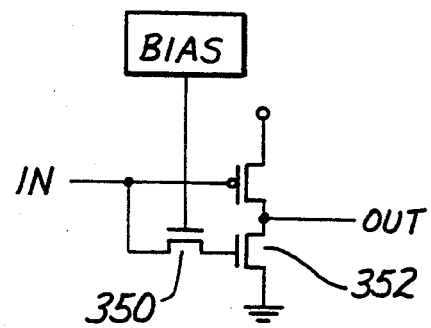
FIG. 25 is a schematic diagram of a prior art output buffer circuit.

The circuit of the invention solves the prior art problem discussed in connection with FIG. 25 by making a definite decision to directly increase the circuit speed to allow optimum performance without degradation for a slow circuit and slow conditions by providing slowing bias compensation only for fast or normal conditions within the circuit.

Figure 26:
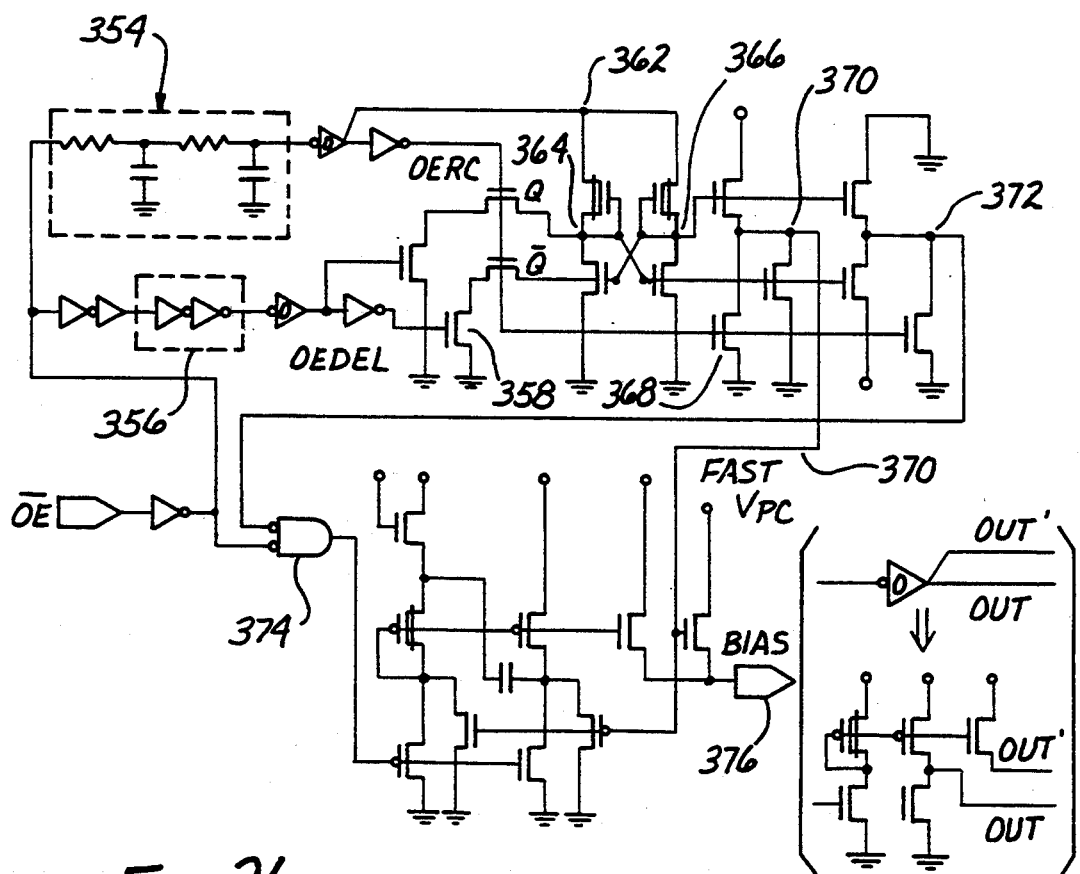
FIG. 26 is a schematic diagram of a bias circuit for an output buffer circuit incorporating the invention.

Turn now to the schematic of FIG. 26. An RC type delay circuit, generally denoted by reference numeral 354, uses resistors and capacitors to generate a time delay which is largely independent of process, temperature and voltage variations. A second time delay circuit 356 is a gated delay circuit which uses a plurality of inverters and is constructed to be fairly representative of the general speed of the LSI circuit. The output enable signal, OE-, is provided to the input of an inverter 358 whose output in turn is provided to the input of time delay circuits 354 and 356.

Figure 27:
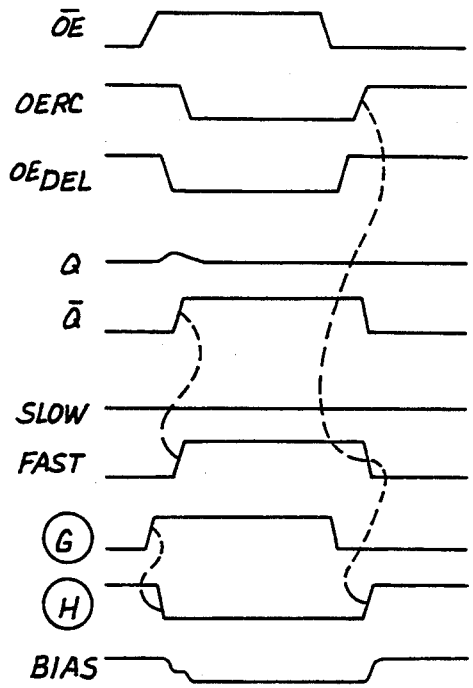
FIG. 27 is a timing diagram of the circuit of FIG. 26 when the typical circuit delay is faster than a predetermined RC delay.

Consider the operation with the delay time of circuit 356, when the inverter induced delay is smaller than the delay induced by the RC delay circuit 354. In this case, when OE- transitions from a logic low to a logic high, the signal OEDEL applied to the gate of transistor 358, changes from a logic high to a logic low before the signal OERC applied to the gates of transistors 360 changes from a logic high to a logic low. The signal at node 362 becomes high before OERC and OEDEL applied to the gates of transistors 360 and 358, respectively. As a result, the Q signal at node 364 and the Q- signal at node 366 are latched low and high, respectively. OERC is also coupled to the gates of transistors 368. Thus, even when OERC goes from high to low, the signal at node 370, the signal FAST, will go from low to high while the signal at node 372, the signal SLOW, will remain low because Q and Q- are latched at nodes 364 and 366. On the other hand, when the input to delay circuits 354 and 366 makes a transition from high to low, the output of NAND gate 374 changes from low to high. At this time the signal FAST is still at a logic low and causes the bias output 376 to momentarily enter a high-impedance state. When signal FAST transitions from low to high, the bias output reaches the precharge voltage VPC. Timing of the operation of the circuit of FIG. 26 in this instance is summarized by the timing diagram of FIG. 27.

Figure 28:
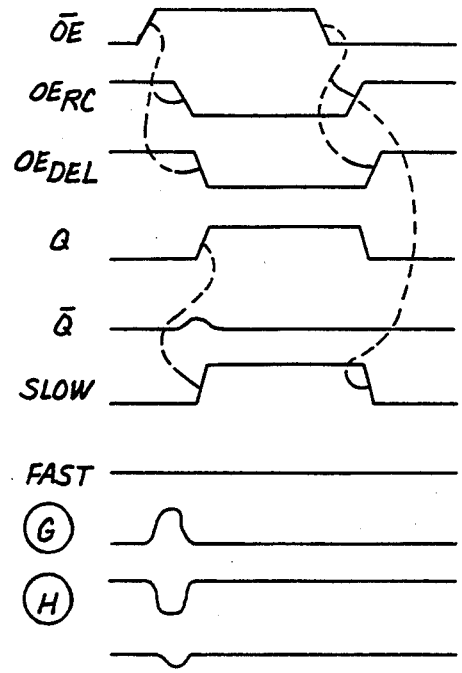
FIG. 28 is a timing diagram of the circuit of FIG. 26 when the substratetypical circuit delay is slower than a predetermined RC delay.

However, if the time delay of circuit 354 is less than the time delay of circuit 356, the following operation occurs as is summarized in connection with the timing diagram of FIG. 28. Therefore, OERC changes from high to low before OEDEL changes from high to low. The voltage at node 362 becomes high either before OERC or OEDEL. Therefore, Q is latched high and Q- latched low.

Next, even though OEDEL changes from high to low, the signal SLOW will change from low to high and FAST will remain low because Q and Q- are latched at high and low, respectively.

On the other hand, when the input to time delay circuits 354 and 356 transition from high to low, the output of NAND gate 375 changes from low to high because the signal SLOW is still at a logic low. The output biases 376 momentarily enters a high impedance state. However, SLOW switches from low to high and the output of NAND gate 374 consequently switches from high to low with the bias voltage returning to VCC.

The circuit of FIG. 26 couples the output enable signal through an RC delay circuit and gated delay circuit and compares the speed of the two. By switching the bias voltage, depending on the speed of the two signals, it is possible to construct a circuit in which the delay of the output buffer does not increase unacceptably while voltage compensation to reduce noise reduction is provided even when the gate delay is increased by process variations. This is achieved by setting the constant RC time delay of circuit 354 to a delay relative to the typical circuit delay of circuit 356, so that the slower circuits as modeled by gated delay circuit 356 and as affected by temperature and voltage conditions are determined to be slow. If this determination is made, the bias voltage is adjusted so that additional slowing of the output buffer does not occur. If it is judged that faster circuit or operating conditions are achieved, then the needed compensation of the bias voltage is supplied. As a result, the worse case speeds specifications of the circuit are not affected.

Figure 29:
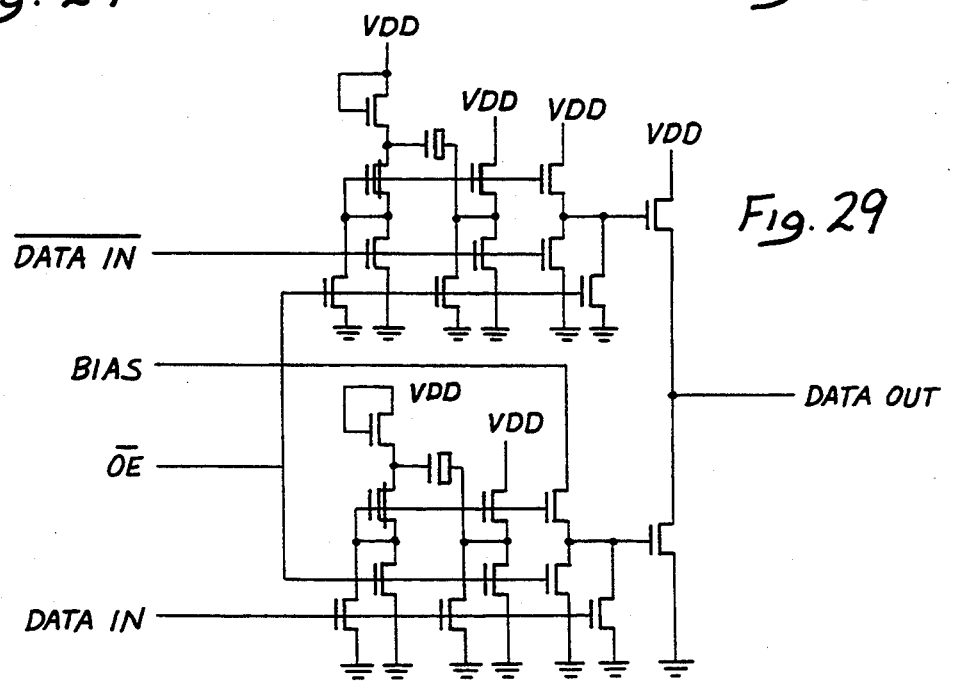
FIG. 29 is a schematic diagram of an NMOS output buffer circuit incorporating the bias signal discussed in connection with FIGS. 26–28.
Figure 30:
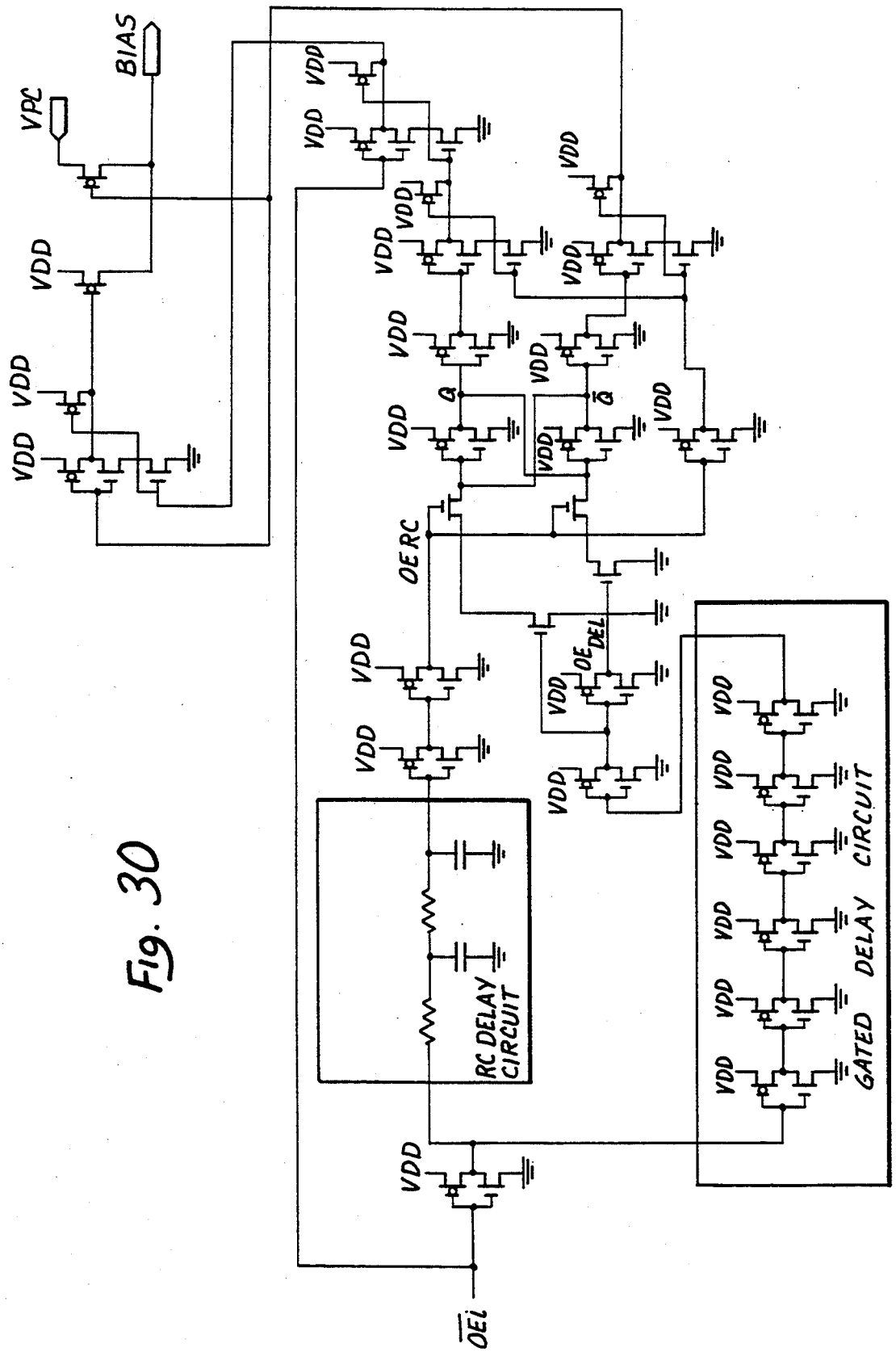
FIG. 30 is a schematic diagram of a CMOS circuit for equivalently performing the functions discussed in connection with the NMOS circuit of FIG. 26.
Figure 31:
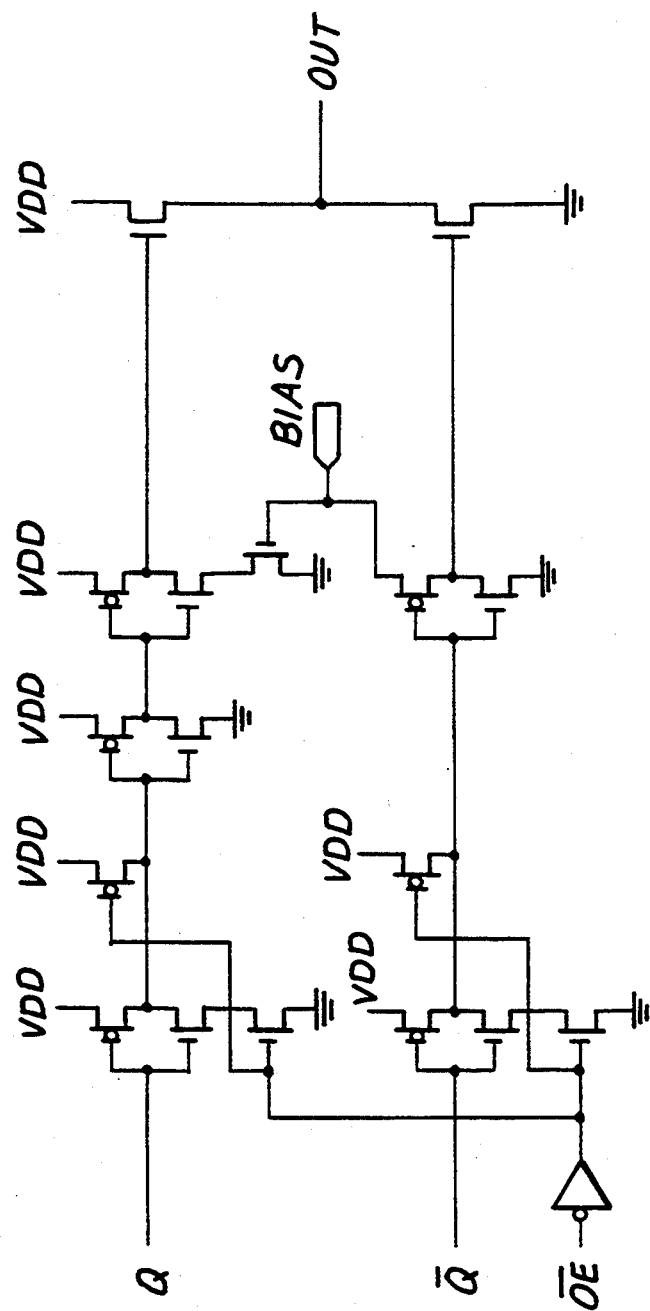
FIG. 31 is a schematic diagram of a CMOS output buffer circuit for use in combination with the bias circuit of FIG. 30.

Additional output buffer circuits to those shown in FIG. 14 are depicted in FIGS. 29-31. FIG. 29 is a schematic of an NMOS output buffer using the bias control of the invention; FIG. 30 is a CMOS equivalent circuit to that depicted in FIG. 26, while FIG. 31 is a CMOS output buffer circuit which run by the bias signal generated by the CMOS circuit of FIG. 30.

In the prior art a back-bias generator, driven by an on-chip oscillator, is of necessity nonsynchronous with the system memory cycles. This causes occasional noise due to the asynchronous nature as well as to the continuous operation of the back-bias generator. A back-bias generator is not easily synchronized through the memory cycle as its operation is not always periodic in nature and may go for long periods without a cycle.

According to the invention, the back-bias generator is inhibited from causing a pumping action during critical memory cycles by temporarily interrupting the oscillator feedback during the memory cycles while allowing the back-bias generator to operate at all other times.

Figure 32:
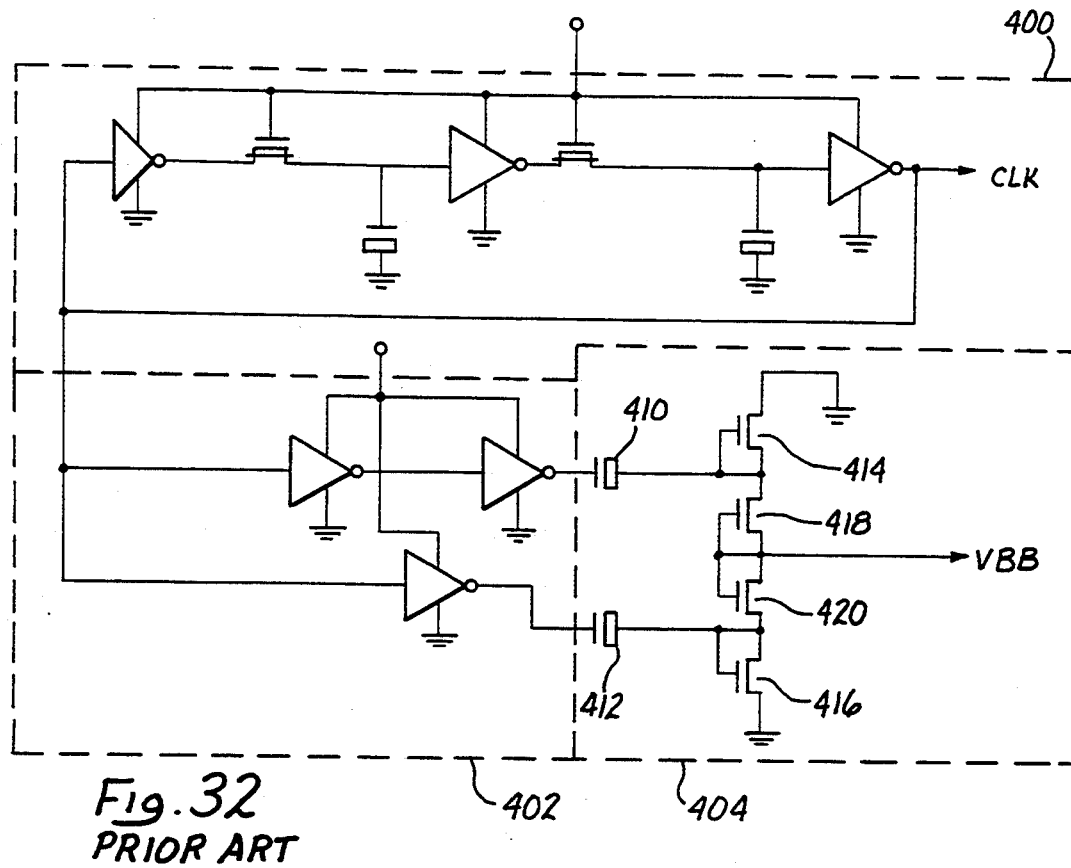
FIG. 32 is a schematic diagram of a substrate charge pump of the prior art.

Turn to FIG. 32 which shows a diagram of a prior an back-bias generator designed as utilized in NMOS VLSI circuits. Prior an back-bias generators are comprised of an oscillator stage 400 which produces a clock signal, CLK, which is also provided to a buffer stage 402 whose output in turn is coupled to a charge pump 404. The output of charge pump 404 is the back-bias voltage, VBB.

Figure 33:
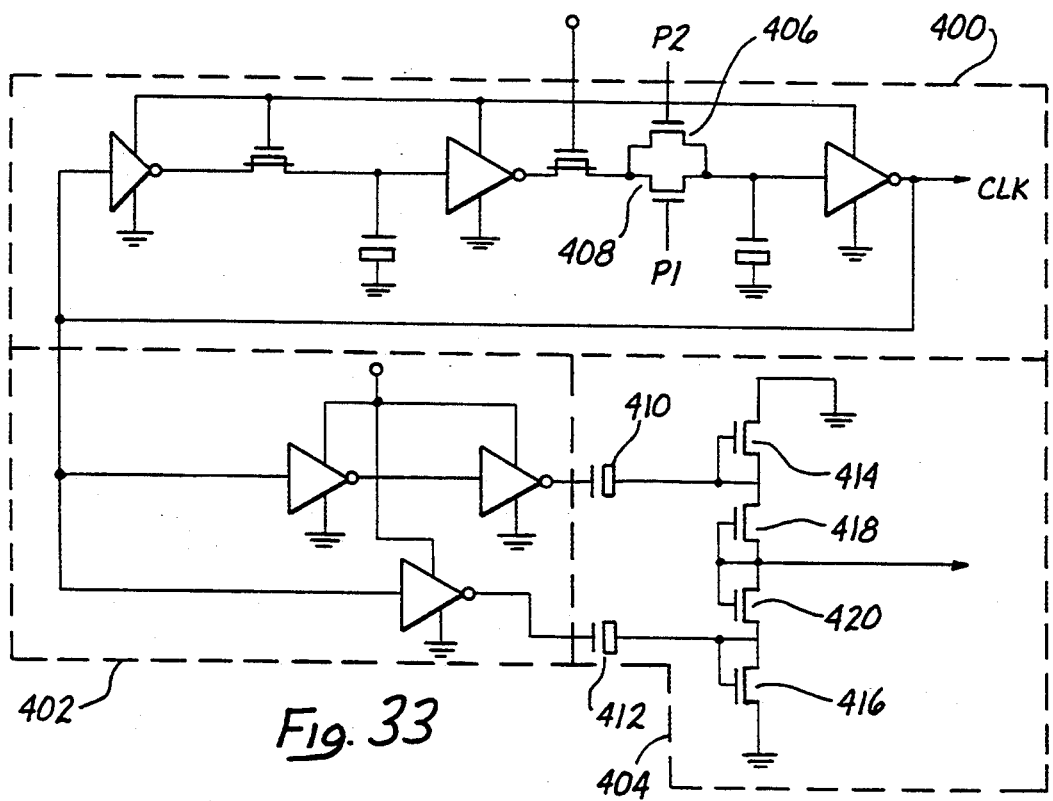
FIG. 33 is a schematic diagram of a substrate charge pump incorporating the invention.

Turn now to FIG. 33 wherein the invention is incorporated into a back-bias generator having two pass transistors added to the circuit of FIG. 31 to interrupt oscillation and therefore the charge pumping action to the substrate whenever neither of the pass transistors are conductive. In particular pass transistor 406 and 408 are coupled in parallel with each other and collectively in series before the last stage output of oscillator 400. Clearly no clock signal is generated unless P1 or P2 is high.

It must be understood that many transistors can be added in parallel or combined in a logical arrangement or that a single transistor could be used as may be desired in place of transistors 406 and 408 shown in the illustrated embodiment. Therefore, either or both of the charge pumping signals P1 and P2 may be high at any time other than at the critical sensing time just prior to the triggering of the sense amplifiers. When P1 or P2 are both high, oscillator 400 runs free with respect to the VLSI circuit. Buffer circuit 402 generates a complementary square wave signal with sufficient drive to charge and discharge pump capacitors 410 and 412 and charge pump 404. When capacitors 410 and 412 are driven high by buffer circuit 402, the capacitors are charged to their maximum through the clamping action transistors 414 and 416, respectively. When capacitors 410 and 412 are driven low by buffer circuit 402, a negative charge is placed on the output of capacitors 410 and 412 which is then driven through transistors 418 and 420 into the substrate.

When P1 and P2 are both low, oscillator 400 will not oscillate. The output of oscillator 400, CLK is held stable and the buffer is therefore inhibited from changing so that charge pump 404 is held inactive. This inactive state of charge pump 404 will remain for ten to twenty nanoseconds to allow most sense amplifiers to reach a decision or achieve a definite state. Thereafter P1 or P2 can be made high, allowing the substrate generator to resume operation.

Prior art-memory circuits usually leave their output drivers enabled during a memory cycle inasmuch as the enable control inputs often remain in an enabled state. This can easily cause intermittent switching of the outputs during inopportune times, such as the time during which the sense amplifier is making a state determination.

According to the invention a control circuit in the form of a conventional set/reset transparent latch disables the output buffers of a memory circuit immediately following the sensing of the address transition, ATD, and maintains this disabled state until new data is available.

Figure 34:
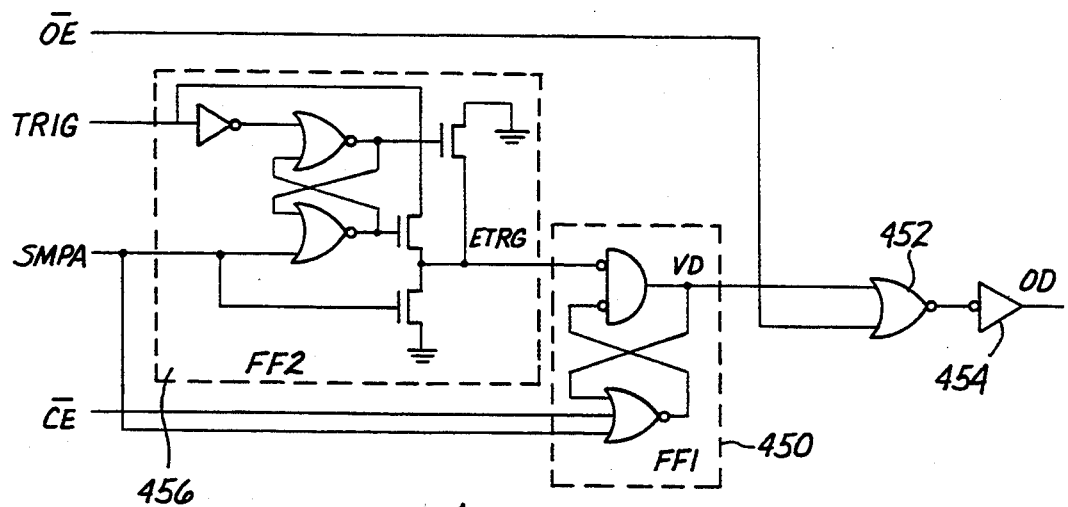
FIG. 34 is a schematic diagram of an output buffer control circuit incorporating the invention.

Turn now to FIG. 34 which is a schematic of a circuit used to control output buffers according to the invention and provide a reset circuit to indicate to other control circuitry that a memory cycle is complete. The circuit of FIG. 34 comprises a first flip-flop 450, which is set when an address transition is detected, namely, when SMPA goes to a logical high. Latch flip-flop 450 is reset only after a sense amplifier cycle is complete, that is, when ETRG goes high. A second flip-flop circuit 456 generates ETRG from the input signals SMPA and TRIG. TRIG is the trigger signal generated by the sense trigger circuit of FIG. 24. SMPA is generated by the circuit of FIG. 5. This provides a timing pulse, JD, from the output of flip-flop 450 which is used to generate an artificial output disable signal, OD, regardless of the state of the external output enable signal OE-. The output of flip-flop 450 is connected to NOR-gate 452 whose output in turn is connected to an inverter 454 used to generate the output disable, OD.

Flip-flop 450 in FIG. 34 is occasionally subject to lock up due to random and unexpected address transition detections strobed by SMPA. Flip-flop 456 provides protection against this possibility by preventing flip-flop 450 from going into an undesired output state when these address transition detections occur during a TRIG pulse. The TRIG pulse indicates the end of a memory cycle. This circuit provides a priority of SMPA over TRIG when a conflict occurs between them. However, if TRIG occurs without SMPA, flip-flop 450 is properly reset.

The features of flip-flop 456 in FIG. 34 give SMPA priority over TRIG when: (1) SMPA pulses high and ETRG is switched to an inactive low state if TRIG is either in a high or low state; (2) a subsequent transition of TRIG from high to low fails to change the logic level of ETRG; and (3) only a transition of TRIG from low to high can change the level of ETRG from low to high, thereby setting JD in flip-flop 450.

In prior art VLSI memory circuits which use address transition detection, the phenomena known as "lock up" is often encountered. Lock up occurs when noise or an unexpected address change at an inopportune time causes the address transition detection circuit to enter an unexpected state for which the memory control circuit has not been designed. As a result, the memory control circuit enters a lock up condition or simply stops operating. Prior an memory circuit designs have attempted to solve the problem by undertaking efforts to avoid the initiating conditions that cause lock up.

According to the present invention a control circuit is provided which protects against spurious ATD occurrences and prevents lock up of critical control latch devices during such a lock-up condition. The control circuit forces the memory circuit along a predetermined operational path to properly provide data to the output from the memory.

Figure 35:
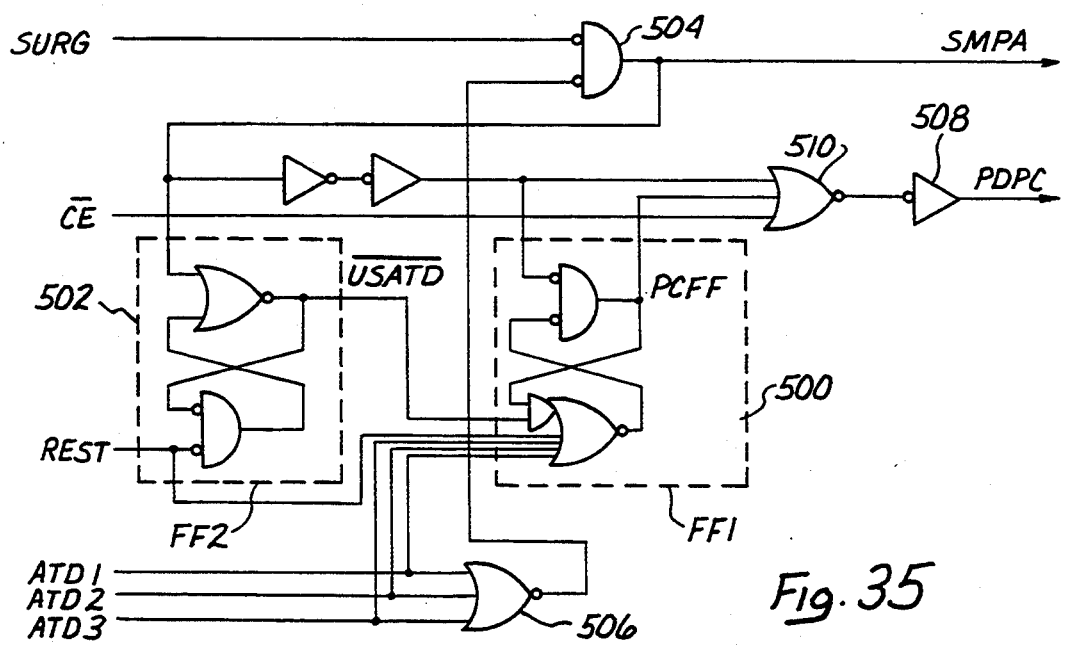
FIG. 35 is a schematic diagram of an address transition detection control circuit incorporating the invention.

Turn now to FIG. 35 wherein a schematic embodiment of the invention is depicted. A first flip-flop 500 acts as a latch to record the event of memory cycle completion. Flip-flop 500 also stores the fact that an address detection is completed such as through the receipt of signals ATD1-3. ATD1-3 are generated by ATD latch 32 and corresponds to three groups of addresses. The reset signal, REST, conventionally generated by timing circuit 39 goes high for a short time upon completion of a-memory cycle and is input to a second flip-flop 502. The output of flip-flop 502, USATD- is provided as an input to flip-flop 500. The purpose of latch 500 is to hold the memory circuit in a precharged state until such time as the address transition detection is accepted as valid and a memory cycle is begun, namely, when SMPA goes high for a short time. SMPA is generated as the output of inverted AND gate 504 whose inputs are SURG from timing circuit 39 and signifies that the output buffers are changing and that address changes at that time should be ignored. This last function is implement through gate 504. The inputs to NOR 506 are ATD1-3. The predecode precharge signal, PDPC, coupled to the memory is output from buffer 508 which is in turn driven by NOR gate 510. The inputs to NOR gate 510 are the output, PCFF, from the precharge flip-flop 500, chip enable CE-, and a delayed form of SMPA.

Latch 502 is provided to prevent misoperation of latch 500. The purpose of latch 502 is prevent an address transition detection latch-up problem by inhibiting any additional latching action of latch 500 after the first SMPA pulse is received and until a memory cycle is complete. This is essential since the address transition detection inputs, ATD1-3, can occasionally conflict with SMPA signals, causing latch 500 to lock to the precharge state when an output is expected.

Many modifications and alterations may be made by those having ordinary skill in the art without departing from the spirit and scope of the invention. Therefore, the illustrated embodiment has been set forth only for the purposes of example and should not be taken as limiting the invention as defined in the following claims. The claims must therefore be read to include all equivalent means for performing substantially the same function even if the function is performed in a substantially different way or manner.

We claim:

1. A memory circuit comprising:
a plurality of word lines;
a memory block comprising a plurality of addressable memory cells coupled to said word lines;
a control circuit coupled to said memory block for producing a plurality of precharge and control signals for reading said memory block;
a word line decoder coupled to said memory block for providing address signals to said memory block;
a dummy word line decoder for generating simulative address signals;
a first and second dummy word line electrically simulative to word lines within said memory block, one of said dummy word lines modeling a previously selected word line within said memory block and the other one of said dummy word lines modeling a newly selected word line within said memory block;
means for alternately designating to said dummy word line decoder which of said first and second dummy word lines models a previously selected word line and a newly selected word line, said means being coupled to said first and second dummy word lines; and
transition control means coupled to said first and second dummy word lines for determining the transitional time when said dummy word lines have set up a complete and valid address, said transition control means being coupled to said control circuit to initiate operation of said control circuit, said transition control means for allowing reading of said memory block by said word line decoder depending upon completion of set up of said valid address as determined by said transition control means.

2. The memory circuit of claim 1 wherein said first and second dummy word lines are constructed to electrically match word lines used within said memory block.

3. A memory circuit comprising:
a plurality of word lines;
a memory block comprising a plurality of addressable memory cells coupled to said word lines;
a control circuit coupled to said memory block for producing a plurality of precharge and control signals for reading said memory block;
a word line decoder coupled to said memory block for providing address signals to said memory block;
a dummy word line decoder for generating simulative address signals;
a first and second dummy word line electrically simulative to word lines within said memory, block one of said dummy word lines modeling a previously selected word line within said memory block and the other one of said dummy word lines modeling a newly selected word line within said memory block;

means for alternately designating to said dummy word line decoder which of said first and second dummy word lines models a previously selected word line and a newly selected word line, said means being coupled to said first and second dummy word lines; and transition control means coupled to said first and second dummy word lines for determining the transitional time when said dummy word lines have set up a complete and valid address, said transition control means being coupled to said control circuit to initiate operation of said control circuit allowing reading of said memory block by said word line decoder depending upon said transition completion as determined by said transition control means, wherein precharge, timing and control signals generated by said control circuit are initiated by said control circuit in response to determinations made by said transition control means as individualized to said memory circuit according to actual observed transition points within said first and second dummy word lines.

4. The memory circuit of claim 1 wherein said control circuit comprises a dummy memory cell constructed to model memory cells within said memory block, said control circuit determining a preselected voltage transition point in the output of said model memory cell to determine the time of complete address setup.

5. The memory circuit of claim 3 wherein said control circuit comprises a dummy memory cell constructed to model memory cells within said memory block, said control circuit determining a preselected voltage transition point in the output of said model memory cell to determine complete address setup.

6. In a memory circuit having an array of addressable memory cells an improvement in a sense amplifier, said sense amplifier for reading output from said memory array, said improvement comprising:

a differential amplifier;

first and second dummy bit lines;

a plurality of word lines coupled to said addressable memory cells;

a first and second plurality of dummy memory cells each capable of being selectively programmed into an ON or OFF state, each dummy memory cell electrically similar to said memory cells in said array, said first plurality of dummy memory cells coupled to said first dummy bit line with as many a possible being programmed into said ON state to provide the most leaky selected OFF word line as practical coupled to said first dummy bit line, said second plurality of dummy memory cells being coupled to said second dummy line with as many of said dummy memory cells being programmed into said OFF state to provide the least leaky ON word line as practical coupled to said second dummy bit line;

a main bit line coupled to said memory cells in said array, an addressed one of said memory cells being selectively coupled to said main bit line;

a buffer having an input coupled to said main bit line and an output coupled to said differential amplifier;

an averaging buffer having an input coupled to said first and second dummy bit lines and an output coupled to said differential amplifier, said differential amplifier for amplifying the difference between the output of said buffer and said averaging buffer, whereby leakage current in said memory circuit is uniformly applied to said main bit line and to said first and second dummy bit lines so that dependence on said leakage current in the output of said sense amplifier is eliminated.

7. The sense amplifier of claim 6 wherein said first plurality of dummy memory cells is disposed within said memory circuit in a region where word line voltage within said memory circuit is at its maximum level to provide the most leaky selected OFF word line as practical coupled to said first dummy bit line.

8. The improvement of claim 6 wherein said second plurality of dummy memory cells is disposed within said memory circuit in a region where word line voltage will be a minimum to provide the least leaky ON word line as practical coupled to said second dummy bit line.

9. The improvement of claim 7 wherein said second plurality of dummy memory cells is disposed within said memory circuit in a region where word line voltage will be a maximum to provide the most leaky selected OFF word line as practical coupled to said first dummy bit line.

10. The improvement of claim 6 wherein said averaging buffer produces at its output a voltage which is substantially the arithmetic average of the voltage on said first and second dummy bit fines, said arithmetic average being substantially equal to sum of the average voltage between the ON and OFF state of said memory cells within said memory array and the leakage voltage within said memory circuit.

11. In a memory circuit having a plurality of addressable memory cells including a trigger circuit for sensing the contents of said memory cells, an improvement comprising:

a first and second dummy word line;

a plurality of word lines coupled to said memory cells;

a first and second plurality of dummy memory cells each capable of being selectively programmed into an ON or OFF state, each dummy memory cell electrically similar to said memory cells in said array, said first plurality of dummy memory cells coupled to said first dummy bit line with as many a possible being programmed into said ON state to provide the most leaky selected OFF word line as practical coupled to said first dummy bit line, said second plurality of dummy memory cells being coupled to said second dummy line with as many of said dummy memory cells being programmed into said OFF state to provide the least leaky ON word line as practical coupled to said second dummy bit line; and sensing stage means for detecting the difference in potential between said first and second dummy word lines, said sensing stage means being coupled to said first and second dummy word lines.

12. The improvement of claim 11 wherein said memory includes output drivers and wherein said sensing stage means determines when there is enough current difference in said first and second dummy word lines to reliably latch data and to turn on said output drivers within said memory circuit.

13. The improvement of claim 11 wherein said memory circuit further includes a sensing stage and wherein said sensing stage has an input which electrically emulates said input of said sensing latch.

14. The improvement of claim 11 further comprising a sense amplifier coupled to said memory cells and wherein said sensing stage determines the amount of current drive received from said first and second dummy word lines which is required before said sense amplifier is allowed to make a decision as to the contents of said addressed memory cell.

15. The improvement of claim 11 further comprising:
amplifier means having its input coupled to the output of said sensing stage means and having an output for generating the amplified difference of said voltage on said first and second dummy word lines;
level detect means having an input coupled to said output of said amplifier means, said level detect means for converting said output of said amplifier means to a preconditioned signal; and
inhibit means for preventing false triggering during a non-sensing time period when a predetermined precharge signal is active.

16. The improvement of claim 11 further comprising a sense amplifier coupled to said memory cells and wherein said sensing stage determines the amount of current drive difference received from said first and second dummy word lines which is required before said sense amplifier is allowed to make a decision as to the contents of said addressed memory cell, said sensing stage means determining when there is enough current in said first and second dummy word lines to latch data and to turn said sense amplifier, and wherein said sensing stage has an input which electrically emulates said input of said sensing latch.

17. In a memory circuit having a memory array with a plurality of addressable memory cells including a sense amplifier for reading the contents of said addressable memory cells, an improvement comprising:
a first and second dummy bit line;
a corresponding first and second plurality of dummy memory cells coupled to said first and second dummy bit lines respectively;
a bit line selectively coupled to an addressable one of said memory cells within said memory array;
a dynamic latch;
averaging means coupled to said first and second dummy bit lines for averaging the voltage on said dummy bit lines and coupling said voltage to said dynamic latch, said bit line also coupled to said dynamic latch, said dynamic latch latching to a logic state depending on whether the logic level on said bit line is higher or lower than the average of said logic levels on said first and second dummy bit lines, said dynamic latch latching to a high logic level when said bit line is at a higher logic level than the average of said logic levels on said first and second dummy bit lines, said dynamic latch latching to a low logic level if the logic level on said bit line is lower than the average logic level on said first and second dummy bit lines; and
first and second buffer circuits coupled to said dynamic latch for coupling the latched state of said dynamic latch to an output.

18. The sense amplifier of claim 17 wherein said first plurality of dummy memory cells is disposed within said memory circuit in a region where word line voltage within said memory circuit is at its maximum level to provide the most leaky selected OFF word line as practical coupled to said first dummy bit line.

19. The improvement of claim 17 wherein said second plurality of dummy memory cells is disposed within said memory circuit in a region where word line voltage will be a minimum to provide the least leaky ON word line as practical coupled to said second dummy bit line.

20. The sense amplifier of claim 19 wherein said first plurality of dummy memory cells is disposed within said memory circuit in a region where word line voltage within said memory circuit is at its maximum level to provide the most leaky selected OFF word line as practical coupled to said first dummy bit line.

21. The improvement of claim 17 further comprising means for disconnecting said dynamic latch from said memory cells of said memory array at all times except during a predetermined addressing time interval so that said dynamic latch is insensitive to noise occurring outside said predetermined addressing time interval.

22. A method comprising the steps of:
generating simulative address signals by a dummy word line decoder;
modeling a previously selected word line within said memory block with one of a first and second dummy word line electrically simulative to word lines within said memory block;
modeling a newly selected word line within said memory block on the other one of said first and second dummy word lines;
alternately designating which of said first and second dummy word lines models a previously selected word line and a newly selected word line; and
determining the transitional time when said dummy word lines have set up a complete and valid address to initiate operation of said control circuit to allow reading of said memory block by said word line decoder depending upon said transition completion.

23. In a memory circuit having an array of addressable memory cells an improvement in a sense amplifier, said sense amplifier for reading output from said memory array, a method comprising the steps of:
providing a first and second plurality of dummy memory cells each capable of being selectively programmed into an ON or OFF state, each dummy memory cell electrically similar to said memory cells in said array, said first plurality of dummy memory cells coupled to a first dummy bit line with as many a possible being programmed into said ON state to provide the most leaky selected OFF word line as practical coupled to said first dummy bit line, said second plurality of dummy memory cells being coupled to a second dummy line with as many of said dummy memory cells being programmed into said OFF state to provide the least leaky ON word line as practical coupled to said second dummy bit line;
selectively coupling an addressed one of said memory cells to a main bit line;
providing a buffer having an input coupled to said main bit line and an output coupled to a differential amplifier; and
amplifying the difference between the output of said buffer and an averaging buffer having an input coupled to said first and second dummy bit lines and an output coupled to said differential amplifier, whereby leakage current in said memory circuit is uniformly applied to said main bit line and to said first and second dummy bit fines so that dependence on said leakage current in the output of said sense amplifier is eliminated.

* * * * *